(12) United States Patent
Matsuura

(10) Patent No.: US 7,279,998 B2
(45) Date of Patent: Oct. 9, 2007

(54) VOLTAGE-CONTROLLED OSCILLATOR

(75) Inventor: Junichi Matsuura, Inagi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 69 days.

(21) Appl. No.: 11/340,790

(22) Filed: Jan. 27, 2006

(65) Prior Publication Data
US 2006/0164178 A1  Jul. 27, 2006

(30) Foreign Application Priority Data
Jan. 27, 2005 (JP) ............... P2005-020028

(51) Int. Cl.
*H03B 5/36* (2006.01)
*H03B 5/32* (2006.01)
*H03L 1/00* (2006.01)

(52) U.S. Cl. .................. 331/116 FE; 331/116 R; 331/158; 331/176; 331/177 V; 331/185

(58) Field of Classification Search ............ 331/66, 331/116 R, 116 FE, 158, 160, 185, 176, 36 C, 331/177 V
See application file for complete search history.

(56) References Cited

U.S. PATENT DOCUMENTS 5,764,112 A * 6/1998 Bal et al. ............ 331/116 FE
6,040,744 A * 3/2000 Sakurai et al. ............. 331/176
6,628,175 B1 * 9/2003 Guo et al. .................. 331/158
2006/0071731 A1 * 4/2006 Tateyama ................... 331/158

FOREIGN PATENT DOCUMENTS

JP            11-220329 A    8/1999
JP         2003-318417 A   11/2003

* cited by examiner

*Primary Examiner*—Robert Pascal
*Assistant Examiner*—Ryan J Johnson
(74) *Attorney, Agent, or Firm*—McDermott Will & Emery LLP

(57) ABSTRACT

With a variable capacitor including a load capacitor of an oscillation circuit having a feedback resistor 1, an inverter 2, and a crystal oscillator 3, and a static capacitance generated between a drain terminal and a gate terminal of MOS transistors 4 and 5, in which source and backgate terminals are shorted to each other, a serial connection of a DC cut capacitor 9, 10 and a variable capacitors (MOS transistor) 4 and 5 is formed between one end and the other end of the crystal oscillator 3. For example, a threshold voltage control signal of the MOS transistors 4 and 5 is input to the drain terminal through a high-frequency elimination resistor 11, 12, and is input to the source-backgate terminal through a high-frequency elimination resistor 7, 8. In addition, a signal obtained by overlapping a temperature characteristic compensation signal and a threshold voltage control signal of the MOS transistor 4, 5 is input to the gate terminal. Accordingly, it is possible to indiscriminately determine an output bias of a temperature compensation control circuit or an external voltage frequency control circuit.

11 Claims, 19 Drawing Sheets

Vg-ds < VTH

CDG ≒ Cdjd+Cdjs

VTH ≦ Vg-ds

CDG ≒ Cox+Cd +Cdjd+Cdjs

CAPACITANCE SWITCHING VOLTAGE

VOLTAGE-CONTROLLED OSCILLATOR

BACKGROUND OF THE INVENTION

1. Field of the Invention

The present invention relates to a voltage-controlled oscillator and, more particularly, to a voltage-controlled oscillator that is used as a voltage-controlled temperature-compensated crystal oscillator.

2. Description of the Related Art

In recent years, with rapid development of mobile communication devices, such as mobile phones, the mobile communication devices are required to have a temperature compensation function, to be miniaturized, and to use a higher frequency. Similarly to the mobile communication devices, a crystal oscillator, which has been used in the mobile communication devices as a standard of a communication frequency, is also required to have a temperature compensation function, to be miniaturized, and to use a higher frequency.

A temperature-compensated crystal oscillator has a temperature compensation function and is designed to reduce a variation of frequency due to temperature variation, and is widely used as a reference frequency source of a mobile phone or the like. A voltage-controlled oscillator is designed to control a frequency by controlling a terminal voltage of a variable capacitor, which is a load capacitor in an oscillating loop and changes a capacitance value by a voltage, to change the load capacitor. There is a temperature-compensated crystal oscillator that is designed to cancel temperature characteristic of a crystal vibrator (piezoelectric vibrator) by controlling the terminal voltage of the variable capacitor in the voltage-controlled oscillator.

Recently, the temperature-compensated crystal oscillator has been designed to have lower phase noise, to shorten driving time, to have higher temperature compensation, and to be miniaturized. A crystal vibrator should necessarily be miniaturized to make a smaller crystal oscillator. However, in case the crystal vibrator becomes small, a change rate of frequency corresponding to a change in a variable capacitor is generally likely to reduce.

Thus, it is necessary to increase the amount of change of variable capacitor, which is used as a load capacitor, with respect to a control voltage. For example, as described in JP-A-2003-318417 and JP-A-11-220329, it is possible to increase a change of capacitance value with respect to a change of a control voltage by using a static capacitance generated between a gate terminal and a source-drain terminal of a MOS transistor, in which the source terminal and the drain terminal are shorted to each other, thereby improving sensitivity of a change in frequency of a crystal oscillator (see FIG. 18). For example, FIG. 16 shows a voltage-controlled oscillator that includes an amplifier having a feedback resistor 1 and an inverter 2, a piezoelectric vibrator 3, and first and second MOS transistors 4 and 5 which serve as variable capacitors and are connected to both terminals of the piezoelectric vibrator 3. In the variable capacitors, source and drain terminals of each of the first and second MOS transistors 4 and 5 are shorted to each other, and the static capacitance generated between the source-drain terminal and the gate terminal of each of the first and second MOS transistors 4 and 5 is controlled by a voltage source 45 that is connected to the gate terminal.

The voltage-controlled oscillator controls a frequency by directly connecting a static capacitance, which is a variable capacitor, generated between a source-drain terminal and a gate terminal of a MOS transistor to a crystal vibrator (piezoelectric vibrator) and an amplifier of an oscillation circuit and by controlling a gate voltage of the MOS transistor so as to change the static capacitance generated between the source-drain terminal and the gate terminal. In this case, when the gate voltage of the MOS transistor is equal to a sum of source-drain terminal voltage and threshold voltage, a channel is formed below a gate oxide film, thereby increasing a static capacitance between the gate terminal and the channel, that is, a static capacitance between the source-drain terminals (at this time, the voltage is referred to as a capacitance switching voltage).

As a first problem of the above-mentioned voltage-controlled oscillator according to the related art, since DC bias of a drain terminal is determined on an amplifier side of an oscillation circuit, it is not possible to set a capacitance switching voltage to a predetermined value and it is thus not possible to control a frequency based on a predetermined gate voltage.

As a second problem that in a typical CMOS process, the capacitance switching voltage is changed depending on a deviation in threshold voltage or the temperature characteristic of a MOS transistor. However, in an example according to the related art, a temperature characteristic compensation signal and an external voltage frequency control signal need to have a characteristic for canceling the deviation in threshold voltage or temperature characteristic of the MOS transistor in order to compensate for the changed capacitance switching voltage. Particularly, when the threshold voltage of the MOS transistor is deviated, the capacitance switching voltage is changed as shown in FIG. 19A. Thus, there is another problem in that a deviation of the oscillation frequency characteristic of the voltage-controlled oscillator in the example according to the related art with respect to a voltage between the gate terminal and the source-drain terminal is large as shown in FIG. 19B, such that the characteristic of the control voltage becomes complicated.

As a third problem, there is another problem in that since the capacitance value is large when the gate voltage is less than the capacitance switching voltage, a variable range of a frequency is small. Since the frequency-capacitor characteristic of the piezoelectric vibrator shows an exponential curve, the variable range of a frequency with respect to a change of capacitor is reduced if the capacitance value is large when the gate voltage is less than the capacitance switching voltage.

As a fourth problem, due to a deviation between an impurity concentration of a channel of a MOS transistor and a concentration of an N-type semiconductor area, a parasitic capacitance between the source-drain terminal and the ground terminal of a MOS variable capacitor is dispersed and a load capacitor of an oscillator is dispersed, thereby increasing a deviation of oscillation frequency. This problem will be described in a variable characteristic of capacitor viewed from each terminal of the MOS variable capacitor in the voltage-controlled oscillator according to the related art.

FIG. 17(a) is a structure of a MOS variable capacitor in a typical CMOS process used in an example according to the related art, which is a three-terminal type variable element including: an N-type epitaxial layer 41 formed in a P-type semiconductor substrate 36, a P-type well layer of backgate 33 formed in the N-type epitaxial layer 41, a thin silicon oxide film 34 and a P-type polysilicon gate electrode 35 formed on the backgate 33, an N-type well layer of source electrode 38 and a drain electrode 39 formed in the backgate 33, and a P-type layer of backgate electrode 40 formed on the backgate 33 and having a higher concentration than the backgate 33, in which the P-type semiconductor substrate 36 and the backgate electrode 40 are grounded, and a control voltage is applied between a source-drain electrode 38 or 39, which is formed by commonly connecting the source electrode 38 and the drain electrode 39 to each other, and the gate electrode 35 to change a capacitance between the source-drain electrode 38 or 39 and the gate electrode 35. Next, a process of changing the capacitance between the source-drain electrode 38 or 39 and the gate electrode 35 by a voltage between the source-drain electrode 38 or 39 and the gate electrode 35 will be described.

In case the MOS variable capacitor of FIG. 17 is used in the voltage-controlled oscillator according to the related art shown in FIG. 16, when the voltage Vg-ds between the gate electrode 35 and the source-drain electrode 38 or 39 is lower than a threshold voltage VTH of the MOS transistor, a depletion layer 37 is generated in the vicinity of a semiconductor surface of a boundary between the backgate 33 and the silicon oxide film 34, thereby generating a depletion layer capacitance Cd. As shown in an equivalent circuit of FIG. 17(b), a capacitance between the source-drain electrode 38 or 39 and the backgate electrode 40 is equal to a parallel capacitor Cdjs+Cdjd of a source-backgate junction capacitance and a drain-backgate junction capacitance, and a capacitance between the gate electrode 35 and the backgate electrode 40 is equal to a serial capacitance of a gate oxide film capacitor Cox and a depletion layer capacitance Cd. As shown in FIG. 16, the gate electrode 35 is biased with a direct current (DC) signal by the voltage source 45 and has the same potential as that of the backgate electrode 40 in an alternating current (AC) signal. Since the source-drain electrode 38 or 39 is biased with an AC signal from the piezoelectric vibrator 3 and the inverter 2, an AC capacitance between the source-drain electrode 38 or 39 and the gate electrode 35 approximates to the parallel capacitor Cdjs+Cdjd of the source-backgate junction capacitance and the drain-backgate junction capacitance.

Next, as shown in FIG. 17(c), when the voltage Vg-ds between the gate electrode 35 and the source-drain electrode 38 or 39 is greater than the threshold voltage VTH, minority carrier electrons are induced to form a reverse layer (channel) on a semiconductor surface of a boundary between the backgate 33 and the silicon oxide film 34, and the depletion layer 37 is not widen, resulting in a constant depletion layer capacitance Cd. In this case, a semiconductor surface of a boundary of the source-drain electrode 38 or 39 and the backgate 33 and the silicon oxide film 34 are in the same potential by the channel formed below the gate oxide film. Thus, as shown in FIG. 16, the gate electrode 35 has a direct current (DC) signal biased by the voltage source 45 and has the same potential as that of the backgate electrode 40 in an alternating current (AC) signal. Since an AC signal from the piezoelectric vibrator 3 and the inverter 2 is biased in the source-drain electrode 38 or 39, as shown in FIG. 17(d), an alternative capacitance between the source-drain electrode 38 or 39 and the gate electrode 35 approximates to a parallel capacitance Cox+Cd+Cdjs+Cdjd of a capacitance of the gate oxide film, a capacitance of the depletion layer, a capacitance of the source-backgate junction, and a capacitance of the drain-backgate junction, thereby obtaining a maximum capacitance (referred to as capacitance switching voltage).

In this case, due to a deviation between an impurity concentration of a channel of the MOS transistor and a concentration of the N-type semiconductor area, the source-backgate junction capacitance Cdjs, the drain-backgate junction capacitance Cdjd, and the depletion layer capacitance Cd (particularly, the depletion layer capacitance Cd) are dispersed. Accordingly, as shown in FIG. 18, when the voltage Vg-ds between the gate electrode 35 and the source-drain electrode 38 or 39 is lower than the capacitance switching voltage, the capacitance between the source-drain electrode 38 or 39 and the gate electrode 35 is dispersed by a deviation between the source-backgate junction capacitance Cdjs and the drain-backgate junction capacitance Cdjd, and a maximum value f0max of oscillation frequency of the voltage-controlled oscillator according to the related art shown in FIG. 16 is dispersed by the capacitance deviation. Similarly, as shown in FIG. 18, when the voltage Vg-ds between the gate electrode 35 and the source-drain electrode 38 or 39 is higher than the capacitance switching voltage, the capacitance between the source-drain electrode 38 or 39 and the gate electrode 35 is dispersed by a deviation between the source-backgate junction capacitance Cdjs, the drain-backgate junction capacitance Cdjd, and the depletion layer capacitance Cd, and a minimum value f0min of oscillation frequency of the voltage-controlled oscillator according to the related art shown in FIG. 16 is dispersed by the capacitance deviation.

Accordingly, in order to facilitate designing a crystal oscillator using the static capacitance generated between the source-drain terminal and the gate terminal, there is a problem in that the static capacitance generated between terminals of the MOS transistor is required to be enlarged or the static capacitance is required to be enlarged through the use of an array structure, the threshold voltage control signal of the MOS transistor needs to be controlled independently of the temperature characteristic compensation signal and the external voltage frequency control signal, and the deviation of static capacitance generated between the source-drain terminal and the gate terminal needs to be reduced.

SUMMARY OF THE INVENTION

This invention is made in consideration of the above mentioned problems and it is an advantage of the invention that the invention provides a voltage-controlled oscillator which does not reduce a variable range of frequency and is easy to control oscillation frequency.

That is, it is another advantage of the invention that the invention provides a voltage-controlled oscillator which reduces a deviation of static capacitance to equal to or more than a capacitance switching voltage or equal to or less than the capacitance switching voltage by preventing the static capacitance generated between terminals of the MOS transistor from increasing equal to or less than the capacitance switching voltage, and is capable of controlling a threshold voltage of the MOS transistor independently of a temperature characteristic compensation signal and an external voltage frequency control signal.

In order to achieve the above-mentioned advantage, a voltage-controlled oscillator according to the invention includes: an amplifier which includes an inverter and a feedback resistor; a piezoelectric vibrator which is connected to input and output terminals of the amplifier; a variable capacitive element which includes a variable capacitor and first and second DC cut capacitors in which each one end thereof is respectively connected to both terminals of the piezoelectric vibrator severing as a load capacitance between the terminals of the piezoelectric vibrator. The variable capacitor includes: first and second MOS transistors, in which a drain terminal is connected to the other end of the first and second DC cut capacitors, source and backgate terminals are shorted to each other, and a gate terminal is shorted; first and second high-frequency elimination resistors in which one end thereof is connected to each of a source-backgate terminal of the first and second MOS transistors; and third and fourth high-frequency elimination resistors in which one end thereof is respectively connected to each of the drain terminals of the first and second MOS transistors and the other end is connected to each other. The voltage-controlled oscillator includes a static capacitance generated between the drain and gate terminals of the first MOS transistor and a static capacitance generated between the drain and gate terminals of the second MOS transistor. The voltage-controlled oscillator controls an oscillation frequency by using a first control signal which is input to the gate terminals connected to the first and second MOS transistors when an oscillation voltage is applied to the drain terminals of the first and second MOS transistors, and a second control signal which is input to each drain terminals of the first and second MOS transistors through the third and fourth high-frequency elimination resistors, respectively, and is input to the source-backgate terminals of the first and second MOS transistors through the first and second high-frequency elimination resistors, respectively.

According to the above-mentioned configuration, it is possible to minimize a capacitance and to increase the variable amount of frequency equal to or less than the capacitance switching voltage by changing a connection of the first and second MOS transistors and adding the first to fourth high-frequency elimination resistors and the first and second DC cut capacitors without increasing the number of elements, thus reducing the device size. In addition, it is possible to control the threshold voltage of the MOS transistor to control the capacitance switching voltage by using first and second control signals which can be independently controlled, and to change the frequency based on a predetermined control voltage. Further, it is possible to reduce the deviation of capacitance equal to, more or less than capacitance switching voltage, thereby reducing the deviation of oscillation frequency of the voltage-controlled oscillator.

In addition, it is preferable that the MOS transistors capable of controlling the capacitance switching voltage is connected to both terminals of the piezoelectric vibrator. However, it is also preferable that the MOS transistor capable of controlling the capacitance switching voltage is connected to only one end of the piezoelectric vibrator so as to input a control signal to the other end through the high-frequency elimination resistor.

That is, a voltage-controlled oscillator according to the invention includes: an amplifier which includes an inverter and a feedback resistor; a piezoelectric vibrator which is connected to input and output terminals of the amplifier; a variable capacitive element which includes a variable capacitor and first and second DC cut capacitors which are disposed between both terminals of the piezoelectric vibrator and each of which is connected to one end of the piezoelectric vibrator, and a variable capacitor, in which the variable capacitor includes: a MOS transistor having a drain terminal connected to the other end of the first or second DC cut capacitor, source and backgate terminals shorted to each other, and a gate terminal shorted to a gate terminal of the remaining MOS transistor; a first high-frequency elimination resistor connected to one end of the source-backgate terminal of the MOS transistor; and a third high-frequency elimination resistor connected to one end of the drain terminal of the MOS transistor, and in which the voltage-controlled oscillator controls an oscillation frequency by varying a static capacitance generated between the drain and gate terminals of the MOS transistor by means of a first control signal which is input to the gate terminal of the MOS transistor when an oscillation voltage is applied to the drain terminal of the MOS transistor, and a second control signal which is input to the other end of the first or second DC cut capacitor through the fourth high-frequency elimination resistor.

According to the above-mentioned configuration, it is possible minimize a capacitance equal to or less than the capacitance switching voltage and to increase the variable amount of frequency by changing a connection of the MOS transistor and adding at least three high-frequency elimination resistors and two DC cut capacitors without increasing the number of elements, thus reducing the device size. In addition, it is possible to control the threshold voltage of the MOS transistor to control the capacitance switching voltage by using first and second control signals which can be independently controlled, and to change the frequency based on a predetermined control voltage. Further, it is possible to reduce the deviation of capacitance equal to, more or less than capacitance switching voltage, thereby reducing the deviation of oscillation frequency of the voltage-controlled oscillator.

In the voltage-controlled oscillator according to the invention, the variable capacitive element includes the first and second DC cut capacitors connected between both terminals of the inverter and both terminals of the piezoelectric vibrator.

According to the above-mentioned configuration, since the capacitor seen from the piezoelectric vibrator is equal to a parallel connection of the variable capacitor and the first and second DC cut capacitors, it is possible to increase an absolute value of capacitor width of the variable capacitor, i.e., the first and second MOS transistors.

In addition, in the voltage-controlled oscillator according to the invention, the variable capacitive element includes a DC connector among the first DC cut capacitor, the variable capacitor, and the second DC cut capacitor included in between the both terminals of the piezoelectric vibrator.

According to the above-mentioned configuration, the capacitor in the piezoelectric vibrator is equal to a serial connection of the first DC cut capacitor, the variable capacitor, and the second DC cut capacitor. Thus, since an absolute value of capacitor width of the variable capacitor, i.e., the first and second MOS transistors is reduced but the negative resistor is increased, it is possible to reduce the starting time.

In addition, in the voltage-controlled oscillator according to the invention, the first control signal may be applied to the first control signal generation circuit, and the second control signal may be applied to the second control signal generation circuit.

According to the above-mentioned configuration, the first and second control signals can be applied from a circuit integrated into the voltage-controlled oscillator rather than an external device, thereby miniaturizing a system which uses the voltage-controlled oscillator.

The first control signal generation circuit may include a first temperature characteristic compensation signal generation circuit and a first deviation control signal generation circuit, and generate, as the first control signal, a signal obtained by overlapping a first temperature characteristic compensation signal, which compensates for crystal oscillation frequency temperature characteristic generated from the first temperature characteristic compensation signal generation circuit, and a first deviation control signal, which cancels MOS transistor threshold voltage deviation and temperature characteristic generated from the first deviation control signal generation circuit, and the second control signal generation circuit may include a first frequency control signal generation circuit, and generate, as the second control signal, a first frequency control signal which controls crystal oscillation frequency generated from the first frequency control signal generation circuit.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first control signal generation circuit may include a second frequency control signal generation circuit and the first deviation control signal generation circuit, and generate, as the first control signal, a signal obtained by overlapping a second frequency control signal, which controls crystal oscillation frequency generated from the second frequency control signal generation circuit and is negative phase which is different from the first frequency control signal, and the first deviation control signal, and the second control signal generation circuit may include a second temperature characteristic compensation signal generation circuit, and generate, as the second control signal, a second temperature characteristic compensation signal which compensates for crystal oscillation frequency temperature characteristic generated from the second temperature characteristic compensation signal generation circuit and is negative phase which is different from the first temperature characteristic compensation signal.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first control signal generation circuit may include the first temperature characteristic compensation signal generation circuit, and generate the first temperature characteristic compensation signal as the first control signal, and the second control signal generation circuit may include the first frequency control signal generation circuit and the second deviation control signal generation circuit, and generate, as the second control signal, a signal obtained by overlapping the first frequency control signal and a second deviation control signal, which cancels MOS transistor threshold voltage deviation and temperature characteristic generated from the second deviation control signal generation circuit and is negative phase which is different from the first deviation control signal.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first control signal generation circuit may include the second frequency control signal generation circuit, and generate the second frequency control signal as the first control signal, and the second control signal generation circuit may include the second temperature characteristic compensation signal generation circuit and the second deviation control signal generation circuit, and generate, as the second control signal, a signal obtained by overlapping the second temperature characteristic compensation signal and the second deviation control signal.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first control signal generation circuit may include the first temperature characteristic compensation signal generation circuit and the second frequency control signal generation circuit, and generate, as the first control signal, a signal obtained by overlapping the first temperature characteristic compensation signal and the second frequency control signal, and the second control signal generation circuit may include the second deviation control signal generation circuit, and generate the second deviation control signal as the second control signal.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first control signal generation circuit may include the first deviation control signal generation circuit, and generate the first deviation control signal as the first control signal, and the second control signal generation circuit may include the second temperature characteristic compensation signal generation circuit and the first frequency control signal generation circuit, and generate, as the second control signal, a signal obtained by overlapping the second temperature characteristic compensation signal and the first frequency control signal.

According to the above-mentioned configuration, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

The first temperature characteristic compensation signal generation circuit may include a first temperature characteristic signal generation circuit and a first controller, and generate a temperature characteristic signal generated from the first temperature characteristic signal generation circuit as the first temperature characteristic compensation signal by an adjustment control signal generated from the first controller, the second temperature characteristic compensation signal generation circuit may include a second temperature characteristic signal generation circuit and the first controller, and generate a temperature characteristic signal generated from the second temperature characteristic signal generation circuit as the second temperature characteristic compensation signal by an adjustment control signal generated from the first controller, the first deviation control signal generation circuit may include a first current generation circuit which increases/decreases an output current with negative phase according to MOS transistor threshold voltage deviation and, at the same time, increases/decreases an output current with negative phase according to MOS transistor temperature characteristic, and a first current-voltage conversion circuit which converts the increase/decrease of the output current of the first current generation circuit into an output signal with negative phase, and generate the output signal of the first current-voltage conversion circuit as the first deviation control signal, the second deviation control signal generation circuit may include a second current generation circuit which increases/decreases an output current with positive phase according to MOS transistor threshold voltage deviation and, at the same time, increases/decreases an output current with positive phase according to MOS transistor temperature characteristic, and a first current-voltage conversion circuit which converts the increase/decrease of the output current of the second current generation circuit into an output signal with negative phase, and generate the output signal of the first current-voltage conversion circuit as the second deviation control signal, the first frequency control signal generation circuit may include a first positive amplification unit, and generate, as the first frequency control signal, a first external control signal applied to the first positive amplification unit with a positive gain added, and the second frequency control signal generation circuit may include a first reverse amplification unit, and generate, as the second frequency control signal, a first external control signal applied to the first reverse amplification unit with a negative gain added.

According to the above-mentioned configuration, it is possible to control the temperature characteristic compensation signal with a high precision by data stored in a non-volatile memory according to a deviation of temperature characteristic of oscillation frequency of each crystal.

The gate terminal of the first MOS transistor may be connected to each of a terminal of the second DC cut capacitor, which is not connected to the input terminal of the inverter, and one end of a terminal of a fifth frequency elimination resistor, instead of the second MOS transistor, second high-frequency elimination resistor, and fourth high-frequency elimination resistor (even though the configuration has been described above), and the first control signal may be input to the gate terminal of the first MOS transistor through the other end of the fifth high-frequency elimination resistor.

According to the above-mentioned configuration, the voltage-controlled oscillator according to the invention has the same feature as that of the voltage-controlled oscillator according to the respective embodiments. In addition, since the gate and drain terminals of the first MOS transistor are 180° different in phase from each other, the MOS variable capacitor is doubled due to a mirror effect. Accordingly, it is possible to increase a ratio of change in frequency to change in control voltage of MOS variable capacitor, i.e., frequency variable sensitivity. In addition, since a dynamic range of the control voltage increase, it is possible to increase a width of change in frequency. Accordingly, it is possible to reduce the size of the first MOS transistor, thus miniaturizing the chip size.

Since it is possible to minimize a capacitance and to increase the variable amount of frequency equal to or less than the capacitance switching voltage from the load capacitor and frequency characteristic of the piezoelectric vibrator, it is possible to reduce the deviation of static capacitance equal to, more or less than capacitance switching voltage, and to control the threshold voltage of the MOS transistor to control the capacitance switching voltage independently of a temperature characteristic compensation signal and an external voltage frequency control signal, thereby changing the frequency based on a predetermined control voltage.

According to the invention, it is possible to increase a width of change of frequency by minimizing the capacitance equal to or less than the capacitance switching voltage.

In addition, it is possible to reduce the deviation of oscillation frequency by reducing the deviation of static capacitance equal to or less than a capacitance switching voltage or equal to or more than the capacitance switching voltage due to the deviation of the MOS transistor in a typical CMOS process.

In addition, it is possible to control the capacitance switching voltage by independently controlling the threshold voltage of the MOS transistor from a temperature characteristic compensation signal and an external voltage frequency control signal, thereby changing the frequency based on a predetermined control voltage.

It is further possible to input a signal for canceling the threshold voltage deviation and temperature characteristic independently of the MOS transistor from the temperature characteristic compensation signal and the external voltage frequency control signal, thereby conveniently designing the temperature characteristic compensation circuit and the external voltage frequency control circuit.

Accordingly, it is possible to practically use a voltage-controlled oscillator using the static capacitance between terminals of the MOS transistor.

DESCRIPTION OF THE PREFERRED EMBODIMENTS

Exemplary embodiments according to the invention will be described in detail with reference to the accompanying drawings.

First Embodiment

Figure 1:
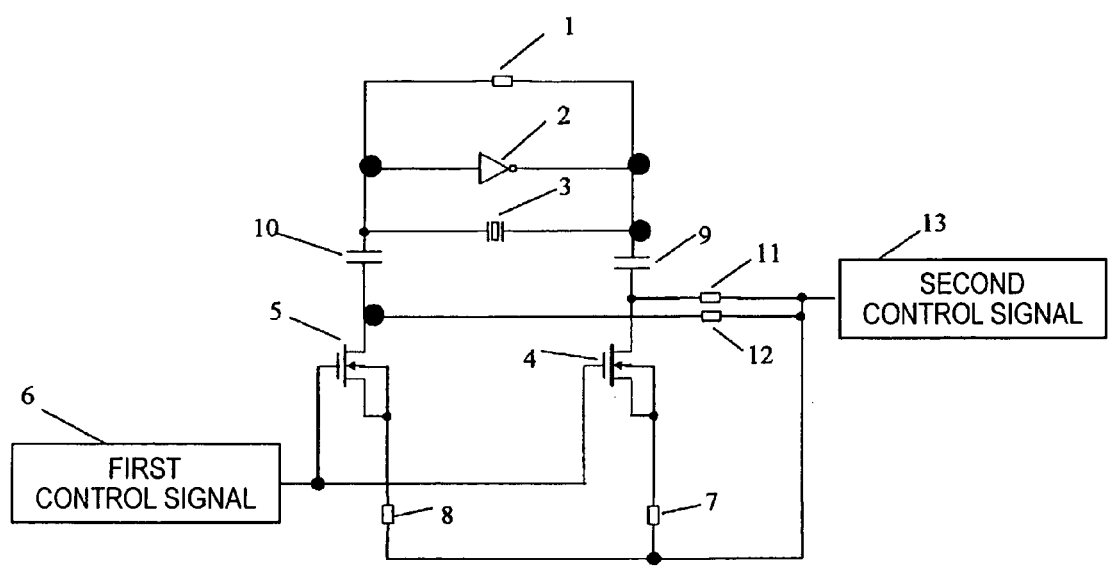
FIG. 1 is a circuit diagram showing a configuration of a voltage-controlled oscillator according to a first embodiment of the invention.

FIG. 1 is a circuit diagram showing a configuration of a voltage-controlled oscillator according to a first embodiment of the invention.

The voltage-controlled oscillator according to the this embodiment includes an amplifier, which has a feedback resistor 1 and an inverter 2, a piezoelectric vibrator 3, which is connected to input and output terminals of the inverter 2, first and second DC cut capacitors 9 and 10, in which each one end thereof is connected to both terminals of the piezoelectric vibrator 3 is connected to one end of the piezoelectric vibrator 3, a load capacitor having first and second MOS transistors 4 and 5, in which each drain terminal is connected to the other end of each of the first and second DC cut capacitors 9 and 10, source and backgate terminals are shorted to each other, and each gate terminal is shorted from the other gate terminal, first and second high-frequency elimination resistors 7 and 8, in which each one end thereof is connected to the source-backgate terminal of each of the first and second MOS transistors 4 and 5, and third and fourth high-frequency elimination resistors 11 and 12, in which one end of thereof is connected to the drain terminals of each of the first and second MOS transistors 4 and 5 and the other ends are connected each other. When an oscillating voltage is applied to the drain terminals of the first and second MOS transistors 4 and 5, the voltage-controlled oscillator controls an oscillation frequency by means of first and second control signals 6 and 13 by varying a static capacitance generated between the drain and gate terminals of each of the first and second MOS transistors 4 and 5 by using the first and second MOS transistors 4 and 5 as MOS variable capacitors. The first control signal 6 is input to the gate terminals of the first and second MOS transistors 4 and 5, and the second control signal 13 is input to the drain terminals of the first and second MOS transistors 4 and 5 through the third and fourth high-frequency elimination resistors 11 and 12, respectively, and is input to the source-backgate terminals of the first and second MOS transistors 4 and 5 through the first and second high-frequency elimination resistors 7 and 8, respectively.

Figure 4:
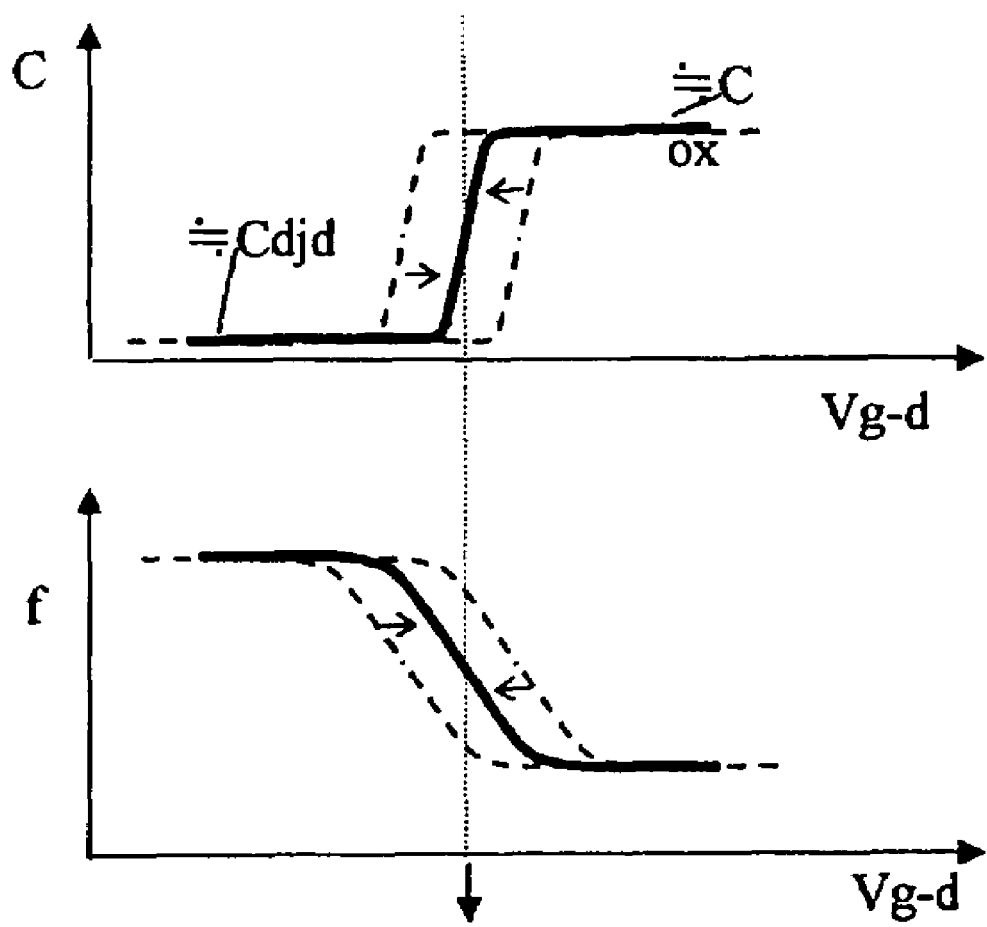
FIG. 4 is a view showing another C-V characteristic and f-V characteristic for explaining the first embodiment of the invention.

FIG. 4 shows C-$V_{g-d}$ and f-$V_{g-d}$ characteristic graphs of a static capacitance generated between the drain and gate terminals of each of the first and second MOS transistors 4 and 5 of a voltage-controlled oscillator according to the first embodiment.

FIG. 4 shows the capacitor C that is abruptly changed due to a voltage in which a threshold voltage is added to a voltage to be applied to a terminal. In the voltage-controlled oscillator according to the first embodiment, the capacitance switching voltage V can be indiscriminately selected by a MOS transistor threshold voltage-controlled signal that is applied to the other end, thereby indiscriminately selecting the capacitance switching voltage, i.e., voltage at which a frequency is switched. Accordingly, it is possible to indiscriminately determine an output bias of a temperature characteristic compensation circuit or an external voltage frequency control circuit, thereby facilitating design.

In addition, FIG. 4 shows C-$V_{g-d}$ and f-$V_{g-d}$ characteristic graphs, which are displayed in a broken line, with respect to static capacitance generated between the drain and gate terminals of each of the first and second MOS transistors 4 and 5 when the threshold voltage is changed due to the deviation or temperature characteristic of the MOS transistor.

In the voltage-controlled oscillator according to the first embodiment, it is possible to cancel the deviation or temperature characteristic of the MOS transistor by applying voltage having a characteristic opposite to the deviation or temperature characteristic as a threshold voltage control signal of the MOS transistor. That is, it is possible to correct the broken line characteristic to the solid line characteristic of FIG. 4 by canceling the deviation of the capacitance switching voltage or the temperature characteristic independently of the temperature characteristic compensation signal or the external voltage frequency control signal. In addition, it is possible to easily design the temperature characteristic compensation circuit or the external voltage frequency control circuit.

In addition, in the voltage-controlled oscillator according to the first embodiment, even though an impurity concentration of a channel of the MOS transistor and a concentration of an N-type semiconductor area are dispersed, a deviation of load capacitance of the oscillator is small, thereby reducing a deviation of an oscillation frequency. This feature will be described in the MOS variable capacitor due to the first and second MOS transistors 4 and 5 in the voltage-controlled oscillator according to the first embodiment when viewed from each terminal.

Figure 2:
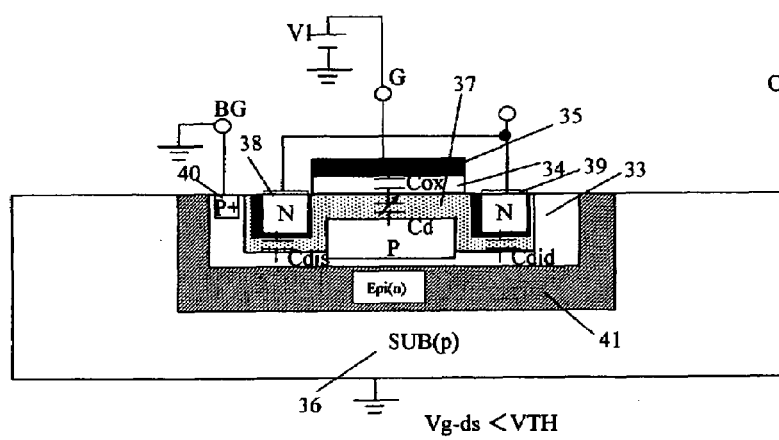
FIGS. 2(a), (b), (c) and (d) are structural diagrams of a MOS variable capacitor according to the invention.
Figure 2:
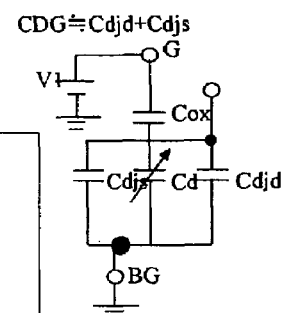
Figure 2:
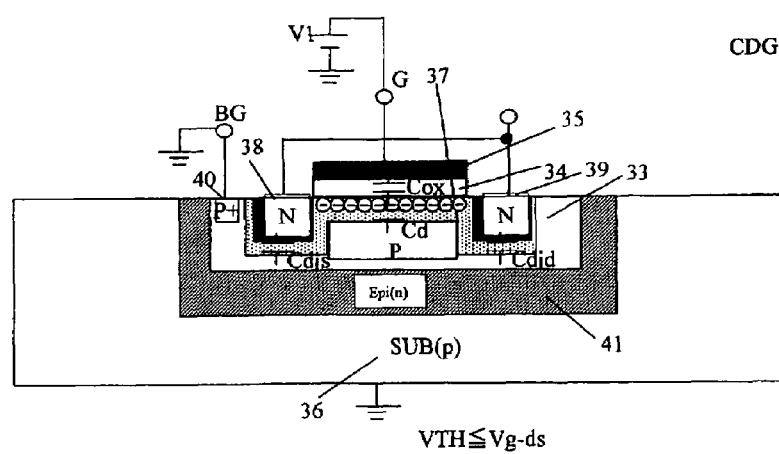
Figure 2:
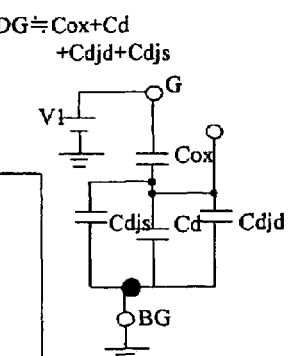
Figure 16:
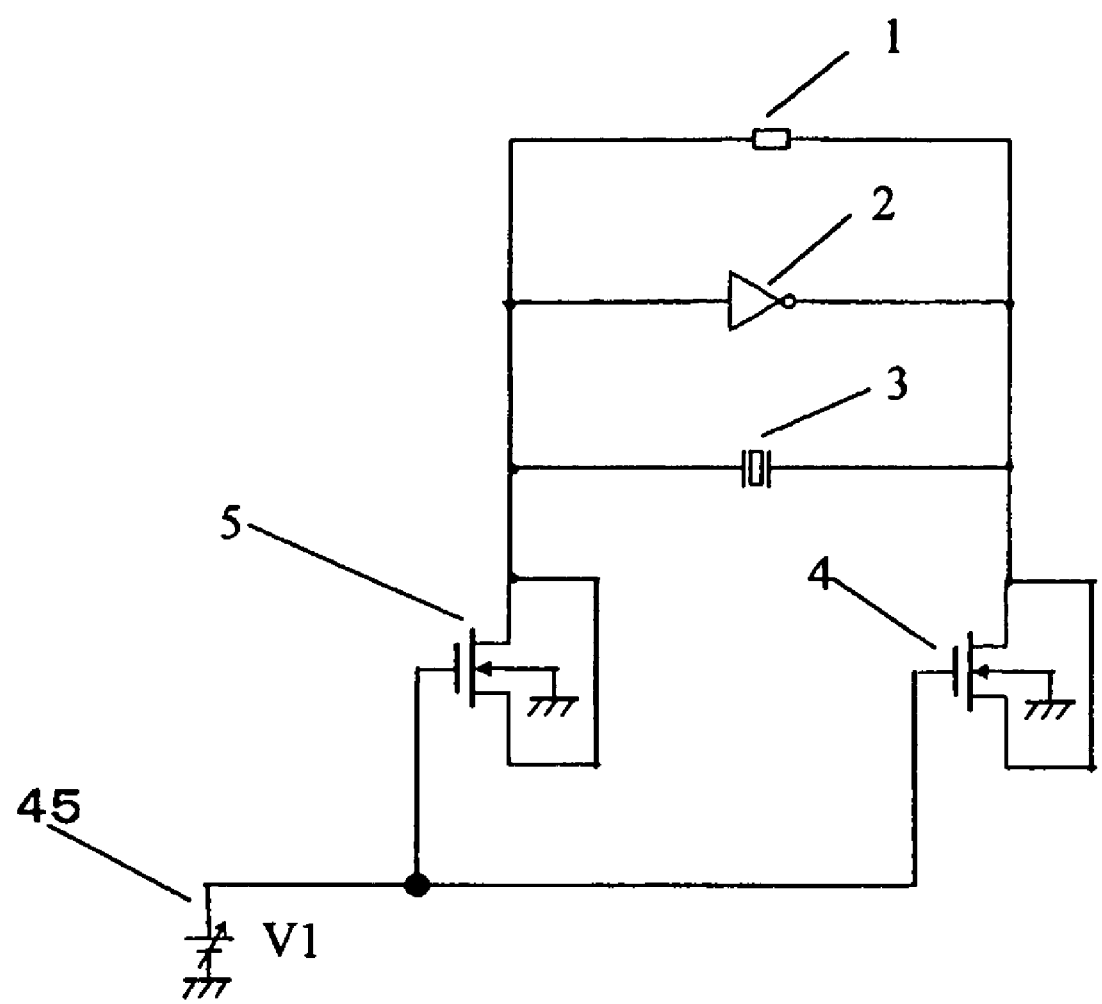
FIG. 16 is a circuit diagram showing a configuration of a voltage-controlled oscillator according to the related art.
Figure 17:
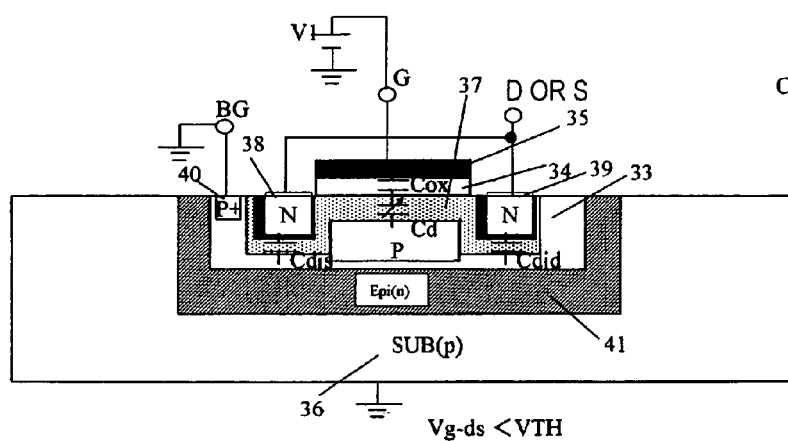
FIGS. 17(a), (b), (c) and (d) are structural views of a MOS variable capacitor according to the related art.
Figure 17:
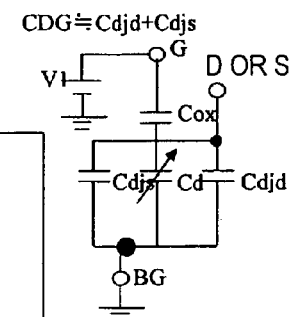
Figure 17:
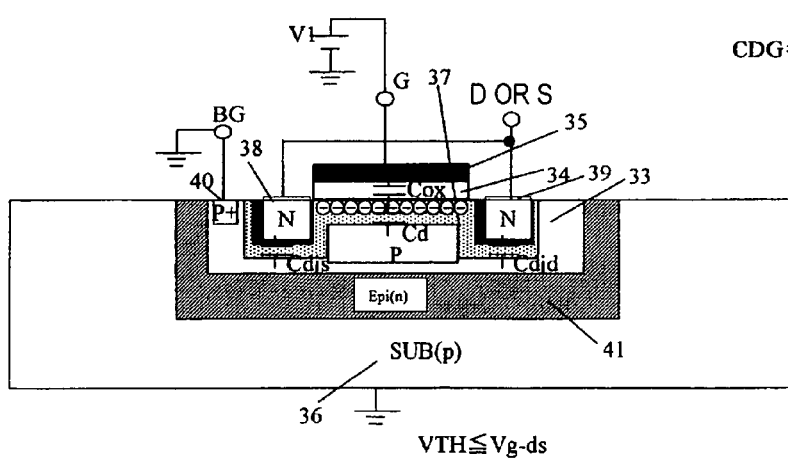
Figure 17:
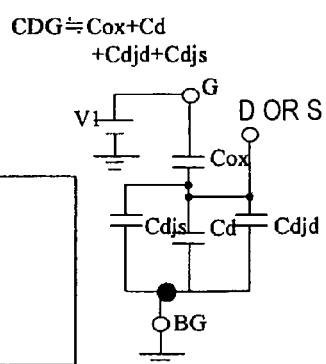

FIG. 2 shows a structure of a MOS variable capacitor in a typical CMOS process that is used in a voltage-controlled oscillator according to the first embodiment. The description of the same parts as those of the MOS variable capacitor used in the voltage-controlled oscillator according to the related art shown in FIG. 16 will be omitted but are denoted by the same reference numerals. The MOS variable capacitor is formed of a three-terminal variable element, in which the P-type semiconductor substrate 36 is connected to a ground terminal, a common electrode of both the source electrode 38 and the backgate electrode 40 is connected to one end of a first PW resistor R1 which is formed of a P-type well layer in a second N-type epitaxial layer 43 which is separated from the N-type epitaxial layer 41 formed on the P-type semiconductor substrate 36, and the drain electrode 39 is connected to one end of a second PW resistor R2 formed of a P-type well layer in a third N-type epitaxial layer 42 which is separated from the N-type epitaxial layer 41 formed on the P-type semiconductor substrate 36. In the MOS variable capacitor, a first control voltage V1, which is the first control signal 6, is applied to the gate electrode 35, is applied to the common electrode of both the source electrode 38 and the backgate electrode 40 through the first PW resistor R1, and is applied to the drain electrode 39 through the second PW resistor R2, and a second control voltage V2, which is the second control signal 13, is applied to change a capacitance between the drain electrode 39 and the gate electrode 35.

A process of changing the capacitance between the drain electrode 39 and the gate electrode 35 by a voltage Vg-d between the drain electrode 39 and the gate electrode 35, Vg-d≈V1−V2, will be described in detail.

In case the MOS variable capacitor of FIGS. 2(a) to 2(d) is used in the voltage-controlled oscillator according to the first embodiment shown in FIG. 1, when the voltage Vg-d between the gate electrode 35 and the drain electrode 39, Vg-d≈V1−V2, is lower than a threshold voltage VTH of the MOS transistor, a depletion layer 37 is generated in the vicinity of a semiconductor surface of a boundary between the backgate 33 and the silicon oxide film 34, thereby generating a depletion layer capacitance Cd. As shown in an equivalent circuit of FIG. 2B, a capacitance between the gate electrode 35 and the backgate electrode 40 is equal to a serial capacitance of a gate oxide film capacitor Cox and a depletion layer capacitance Cd. A capacitance between the source electrode 38 and the backgate electrode 40 is negligible since the source electrode 38 and the backgate electrode 40 are commonly connected. In addition, a capacitance between the drain electrode 39 and the backgate electrode 40 is equal to a drain-backgate junction capacitance Cdjd.

As shown in FIG. 1, a direct current (DC) signal by the first voltage source V1 is biased in the gate electrode 35 and the potential of the gate electrode is equal to a ground potential in an alternating current (AC) signal. An AC signal from the piezoelectric vibrator 3 and the inverter 2 is biased in the drain electrode 39. A DC signal of the second voltage source V2 is biased in the common electrode of the source electrode 38 and the backgate electrode 40 and the drain electrode 39. Since the signal is biased through the first PW resistor R1 and the second PW resistor R2, it is possible to alternately vibrate. An alternating capacitance between the drain electrode 39 and the gate electrode 35 is equal to a serial capacitance of the drain-backgate junction capacitance Cdjd, the gate oxide film capacitance Cox, and the depletion layer capacitance Cd. However, in a typical CMOS process, the gate oxide film capacitance Cox and the depletion layer capacitance Cd are much greater than the drain-backgate conjunction capacitance Cdjd. Thus, the serial capacitance can approximate to the drain-backgate conjunction capacitance Cdjd.

When the voltage Vg-d≈V1−V2 between the gate electrode 35 and the drain electrode 39 is greater than the threshold voltage VTH, minority carrier electrons are induced to form a reverse layer (channel) on a semiconductor surface of a boundary between the backgate 33 and the silicon oxide film 34. In this case, since a semiconductor surface of a boundary of the drain electrode 39 and the backgate 33 and the silicon oxide film 34, the source electrode 38, and the backgate 33 are in the same potential, the depletion layer capacitance Cd, the drain-backgate junction capacitance Cdjd, and the source-backgate junction capacitance Cdjs are negligible.

As described above, as shown in FIG. 1, a direct current (DC) signal by the first voltage source V1 is biased in the gate electrode 35 and the potential of the electrode is equal to a ground potential in an alternating current (AC) signal. An AC signal from the piezoelectric vibrator 3 and the inverter 2 is biased in the drain electrode 39. A DC signal of the second voltage source V2 is biased in the common electrode of the source electrode 38 and the backgate electrode 40 and the drain electrode 39. Therefore, since the signal is biased through the first PW resistor R1 and the second PW resistor R2, it is possible to alternately vibrate. An AC capacitance between the drain electrode 39 and the gate electrode 35 can approximate to the gate oxide film capacitance Cox, resulting in a maximum value.

Figure 3:
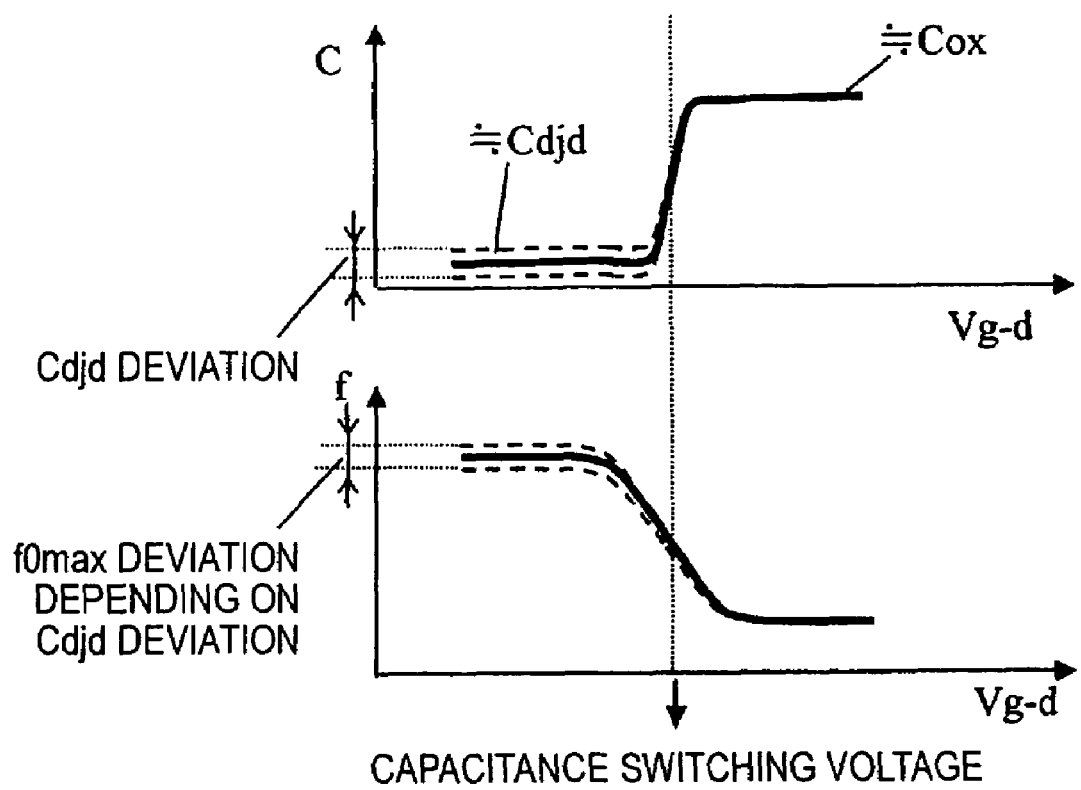
FIG. 3 is a view showing one C-V characteristic and f-V characteristic for explaining the first embodiment of the invention.

The source-backgate junction capacitance Cdjs, the drain-backgate junction capacitance Cdjd, and the depletion layer capacitance Cd (particularly, the depletion layer capacitance Cd) are dispersed due to deviation between an impurity concentration of the channel and a concentration of the N-type semiconductor area of the MOS transistor. As shown in FIG. 3, when the voltage Vg-d between the gate electrode 35 and the drain electrode 39 is lower than the capacitance switching voltage, a capacitance between the gate electrode 35 and the drain electrode 39 is approximately equal to the drain-backgate junction capacitance Cdjd, resulting in deviation of the drain-backgate junction capacitance Cdjd. Thus, it is possible to reduce the deviation compared to the deviation of capacitance between the gate electrode 35 and the drain electrode 39 in the voltage-controlled oscillator according to the related art shown in FIG. 18. In addition, since a maximum value f0max of the oscillation frequency in the voltage-controlled oscillator according to the first embodiment shown in FIG. 1 is dispersed with only the deviation of capacitance, it is possible to reduce the deviation compared to the deviation of the maximum value f0max of the oscillation frequency in the voltage-controlled oscillator according to the related art shown in FIG. 18.

Similarly, as shown in FIG. 3, when the voltage Vg-d between the gate electrode 35 and the drain electrode 39 is greater than the capacitance switching voltage, the capacitance between the gate electrode 35 and the drain electrode 39 is approximately equal to the gate oxide film capacitance Cox, resulting in little deviation. Thus, it is possible to reduce the deviation compared to the deviation of capacitance between the gate electrode 35 and the drain electrode 39 in the voltage-controlled oscillator according to the related art shown in FIG. 18. In addition, since a minimum value f0min of the oscillation frequency in the voltage-controlled oscillator according to the first embodiment shown in FIG. 1 is not dispersed, it is possible to reduce the deviation compared to the deviation of the minimum value f0min of the oscillation frequency in the voltage-controlled oscillator according to the related art shown in FIG. 18.

Figure 18:
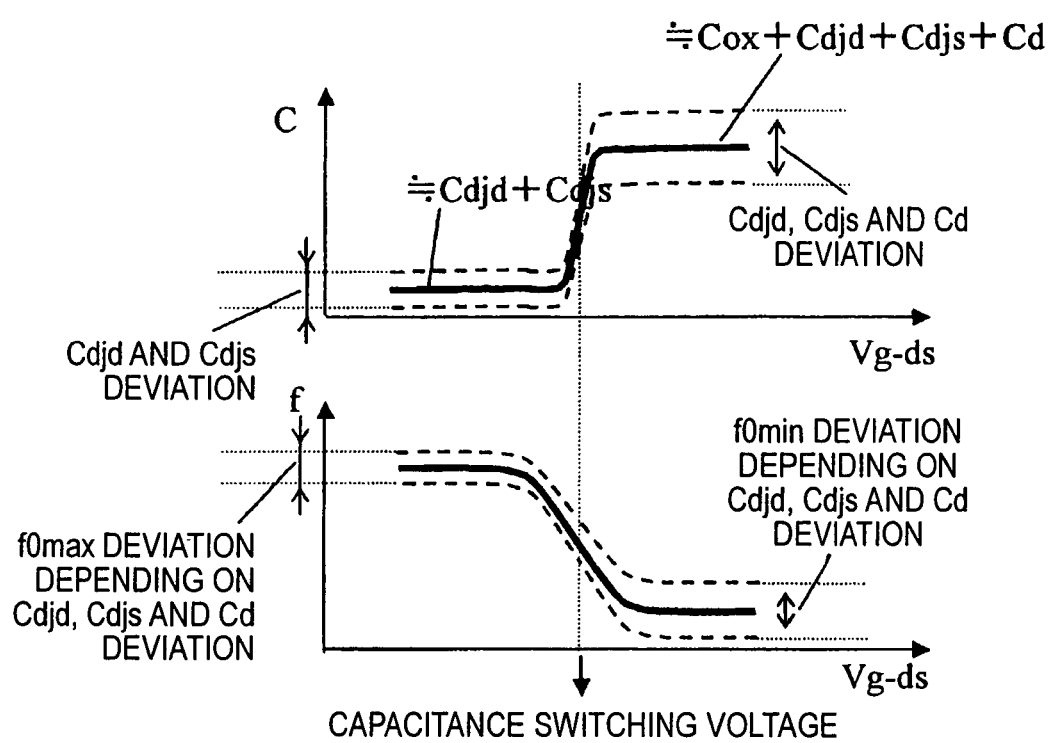
FIG. 18 shows one C-V characteristic and f-V characteristic for explaining the related art.
Figure 19:
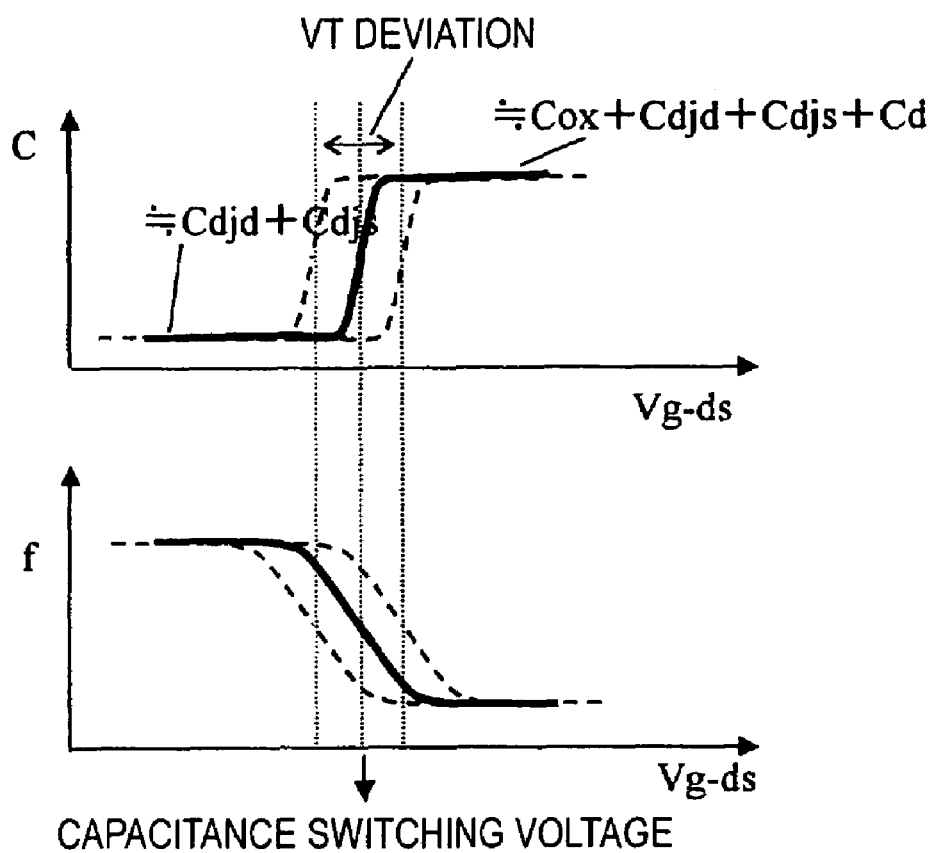
FIG. 19 shows another C-V characteristic and f-V characteristic for explaining the related art.

In the voltage-controlled oscillator according to the first embodiment, the capacitance value of the MOS variable capacitor equal to or less than the capacitance switching voltage can be approximated to the drain-backgate junction capacitance Cdjd as shown in FIG. 3, and is reduced compared to a capacitance value Cdjd+Cdjs of the MOS variable capacitor equal to or less than the capacitance switching voltage in the voltage-controlled oscillator according to the related art shown in FIG. 18, such that it is possible to increase a variable range of frequency with respect to a change in capacitance.

In the voltage-controlled oscillator according to the first embodiment, since the capacitor seen from the piezoelectric vibrator 3 is equal to a series of the first DC cut capacitor 9, the MOS variable capacitor, and the second DC cut capacitor 10, an absolute value of the capacitor width of the variable capacitor consisting of the first and second MOS transistors 4 and 5 is reduced but negative resistor is increased, thereby reducing the starting time.

Second Embodiment

Figure 5:
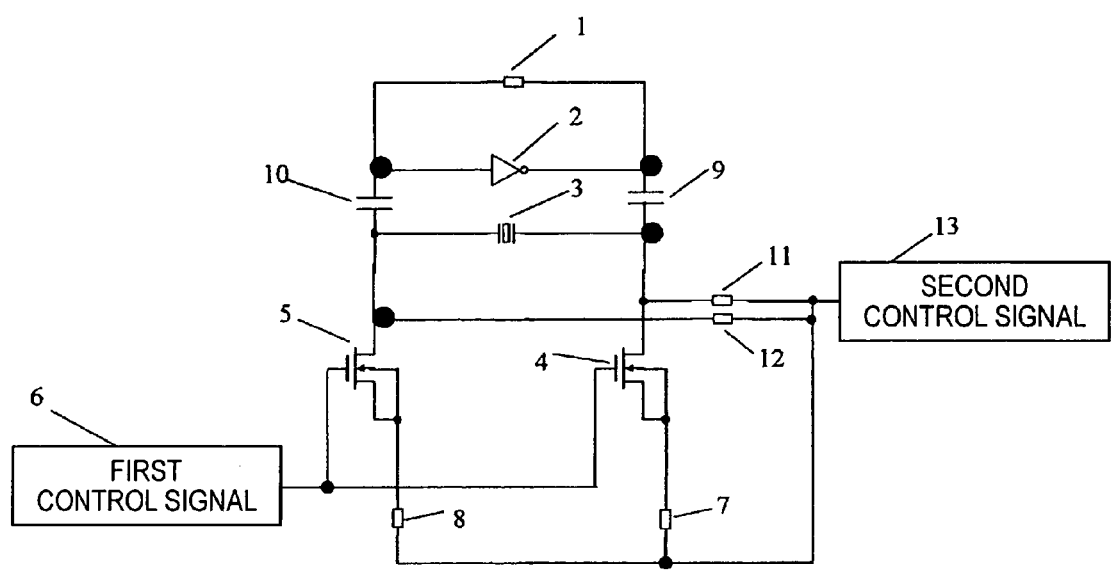
FIG. 5 is a circuit diagram showing a configuration of a voltage-controlled oscillator according to a second embodiment of the invention.

FIG. 5 is a circuit diagram showing a configuration of a voltage-controlled oscillator according to a second embodiment of the invention.

The voltage-controlled oscillator according to the second embodiment is configured such that the first DC cut capacitor 9 and the second DC cut capacitor 10 are connected between both terminals of the inverter 2 and both terminals of the piezoelectric vibrator 3 in the voltage-controlled oscillator according to the first embodiment.

According to the above-mentioned configuration, the voltage-controlled oscillator according to the second embodiment has the same feature as that of the voltage-controlled oscillator according to the first embodiment. In addition, since the MOS variable capacitor consisting of the first and second MOS transistors 4 and 5 and the first and second DC cut capacitors 9 and 10 are connected in parallel to each other when viewed from the piezoelectric vibrator 3, it is possible to increase an absolute value of capacitor width of the MOS variable capacitor consisting of the first and second MOS transistors 4 and 5.

Third Embodiment

Figure 6:
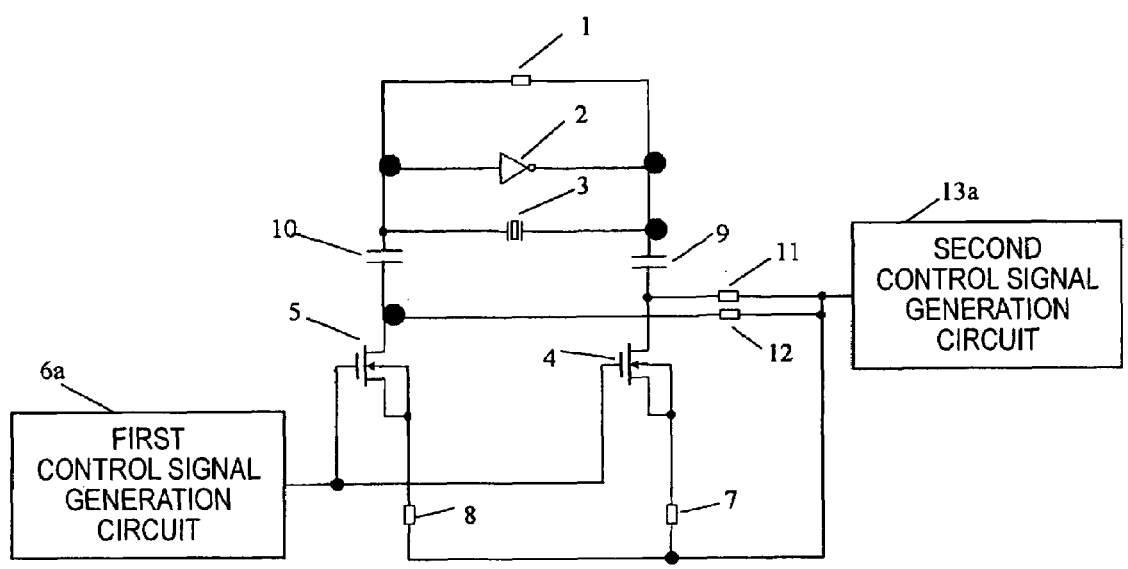
FIG. 6 is a circuit diagram showing a configuration of a voltage-controlled oscillator according to a third embodiment of the invention.

FIG. 6 is a circuit diagram showing a configuration of a voltage-controlled oscillator according to a third embodiment of the invention.

A voltage-controlled oscillator according to the third embodiment is configured such that the first control signal 6 is supplied from the first control signal generation circuit 6*a*, and the second control signal 13 is supplied from the second control signal generation circuit 13*a* in the voltage-controlled oscillator according to the first embodiment.

According to the above-mentioned configuration, the voltage-controlled oscillator according to the third embodiment has the same feature as that of the voltage-controlled oscillator according to the first embodiment. In addition, the first and second control signals 6 and 13 can be supplied from a circuit integrated with the voltage-controlled oscillator rather than an external device, thereby reducing the size of a system that uses the voltage-controlled oscillator.

Fourth Embodiment

Figure 7:
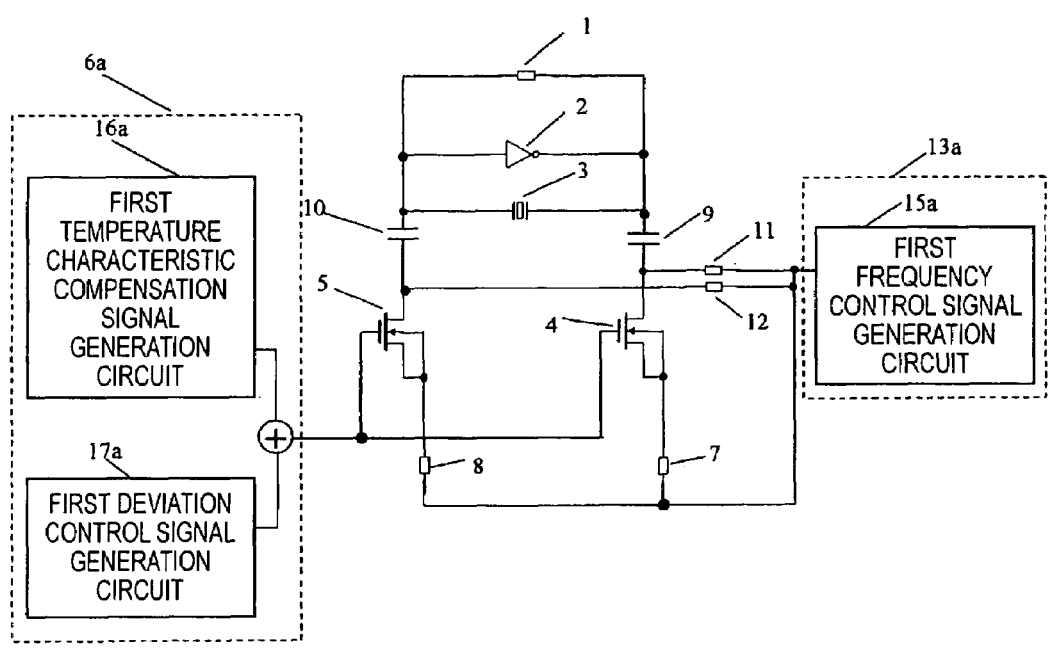
FIG. 7 is a circuit diagram showing a configuration of a voltage-controlled oscillator according to a fourth embodiment of the invention.

FIG. 7 is a circuit diagram showing a configuration of a voltage-controlled oscillator according to a fourth embodiment of the invention.

A voltage-controlled oscillator according to the fourth embodiment is configured such that, in the voltage-controlled oscillator according to the third embodiment, the first control signal generation circuit 6*a* includes a first temperature characteristic compensation signal generation circuit 16*a* and a first deviation control signal generation circuit 17*a*. The first control signal generation circuit 6*a* generates a signal obtained by overlapping a first temperature characteristic compensation signal for compensating for crystal oscillation frequency temperature characteristic generated from the first temperature characteristic compensation signal generation signal 16*a* and a first deviation control signal 6 for canceling the MOS transistor threshold voltage deviation and temperature characteristic generated from the first deviation control signal generation circuit 17*a*, and the second control signal generation circuit 13*a* includes a first frequency control signal generation circuit 15*a* and generates as the second control signal 13 a first frequency control signal for controlling crystal oscillation frequency generated from the first frequency control signal generation circuit 15*a*.

According to the above-mentioned configuration, the voltage-controlled oscillator according to the fourth embodiment has the same feature as that of the voltage-controlled oscillator according to the third embodiment. In addition, it is possible to control the capacitance switching voltage by controlling the MOS transistor threshold voltage independently of the first temperature characteristic compensation signal and the first frequency control signal, thereby changing a frequency based on a predetermined control voltage value.

In addition, since it is possible to input the first frequency control signal independently of the first temperature characteristic compensation signal and the first deviation control signal, thereby conveniently designing the first temperature characteristic compensation signal generation circuit 16*a* or the first frequency control signal generation circuit 15*a*.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Fifth Embodiment

Figure 8:
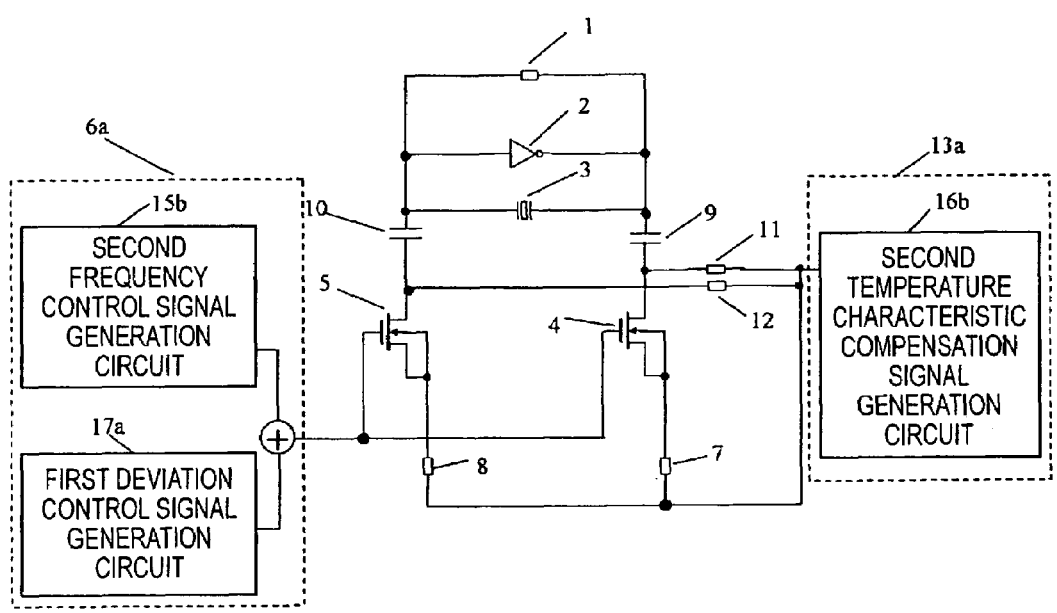
FIG. 8 is a circuit diagram showing a configuration of a voltage-controlled oscillator according to a fifth embodiment of the invention.

FIG. 8 is a circuit diagram showing a configuration of a voltage-controlled oscillator according to a fifth embodiment of the invention.

A voltage-controlled oscillator according to the fifth embodiment is configured such that, in the voltage-controlled oscillator according to the third embodiment, the first control signal generation circuit 6*a* includes a second frequency control signal generation circuit 15*b* and a first deviation control signal generation circuit 17*a* and generates the first control signal 6 obtained by overlapping a second frequency control signal, which is negative phase which is different from the first frequency control signal by controlling the crystal oscillation frequency generated from the second frequency control signal generation circuit 15*b*, and the first deviation control signal, and the second control signal generation circuit 13*a* includes a second temperature characteristic compensation signal generation circuit 16*b* and generates a second temperature characteristic compensation signal, as the second control signal 13, which is negative phase which is different from the first temperature characteristic compensation signal by compensating for the crystal oscillation frequency temperature characteristic generated from the second temperature characteristic compensation signal generation circuit 16*b*.

According to the above-mentioned configuration, the voltage-controlled oscillator according to the fifth embodiment has the same feature as that of the voltage-controlled oscillator according to the third embodiment. In addition, it is possible to control the capacitance switching voltage by controlling the MOS transistor threshold voltage independently of the second temperature characteristic compensation signal and the second frequency control signal, thereby changing a frequency based on a predetermined control voltage value.

In addition, since it is possible to input the second temperature characteristic compensation signal independently of the second frequency control signal and the first deviation control signal, thereby conveniently designing the second temperature characteristic compensation signal generation circuit 16*b* or the second frequency control signal generation circuit 15*b*.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Sixth Embodiment

Figure 9:
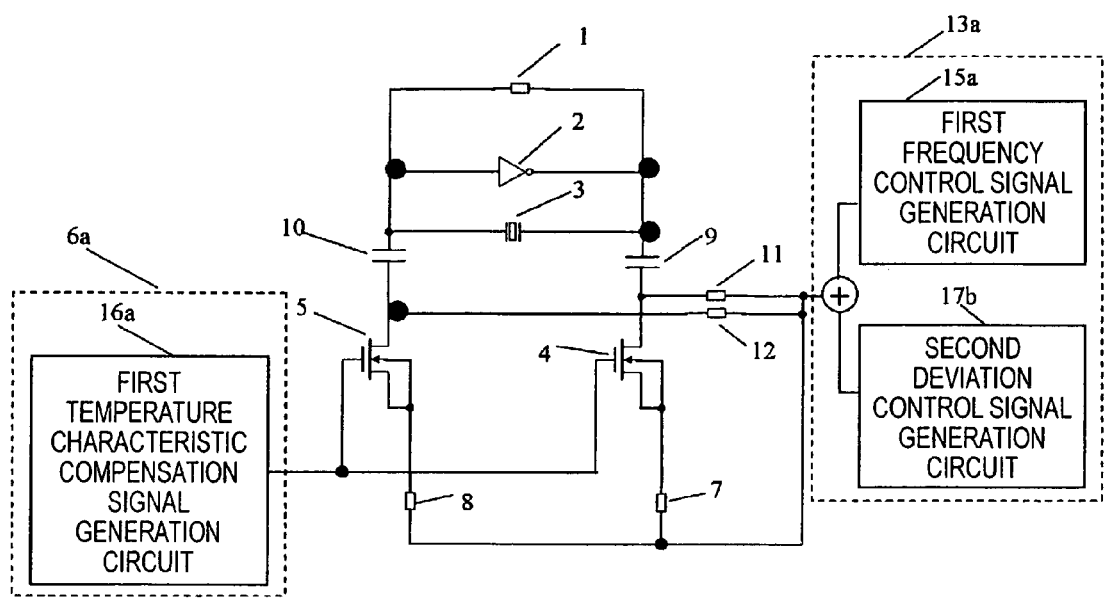
FIG. 9 is a circuit diagram showing a configuration of a voltage-controlled oscillator according to a sixth embodiment of the invention.

FIG. 9 is a circuit diagram showing a configuration of a voltage-controlled oscillator according to a sixth embodiment of the invention.

A voltage-controlled oscillator according to the sixth embodiment is configured such that, in the voltage-controlled oscillator according to the third embodiment, the first control signal generation circuit 6a includes the first temperature characteristic compensation signal generation circuit 16a and generates the first temperature characteristic compensation signal as the first control signal 6, and the second control signal generation circuit 13a includes the first frequency control signal generation circuit 15a and the second deviation control signal generation circuit 17b and generates as the second control signal 13 the first frequency control signal and a second deviation control signal, which is negative phase which is different from the first deviation control signal by canceling the MOS transistor threshold voltage deviation and temperature characteristic generated from the second deviation control signal generation circuit 17b.

According to the above-mentioned configuration, the voltage-controlled oscillator according to the sixth embodiment has the same feature as that of the voltage-controlled oscillator according to the third embodiment. In addition, it is possible to control the capacitance switching voltage by controlling the MOS transistor threshold voltage independently of the first temperature characteristic compensation signal and the first frequency control signal, thereby changing a frequency based on a predetermined control voltage value.

In addition, since it is possible to input the first temperature characteristic compensation signal independently of the first frequency control signal and the second deviation control signal, thereby conveniently designing the first temperature characteristic compensation signal generation circuit 16a or the first frequency control signal generation circuit 15a.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Seventh Embodiment

Figure 10:
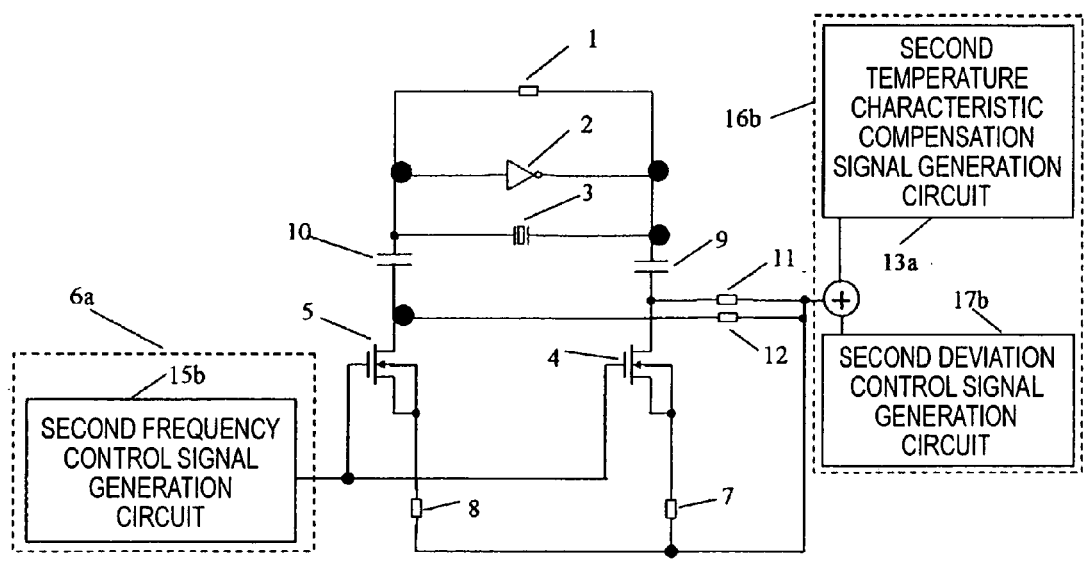
FIG. 10 is a circuit diagram showing a configuration of a voltage-controlled oscillator according to a seventh embodiment of the invention.

FIG. 10 is a circuit diagram showing a configuration of a voltage-controlled oscillator according to a seventh embodiment of the invention.

A voltage-controlled oscillator according to the seventh embodiment is configured such that, in the voltage-controlled oscillator according to the third embodiment, the first control signal generation circuit 6a includes the second frequency control signal generation circuit 15b and generates the second frequency control signal as the first control signal 6, and the second control signal generation circuit 13a includes the second temperature characteristic compensation signal generation circuit 16b and the second deviation control signal generation circuit 17b and generates a signal, as the second control signal 13, obtained by overlapping the second temperature characteristic compensation signal and the second deviation control signal.

According to the above-mentioned configuration, the voltage-controlled oscillator according to the seventh embodiment has the same feature as that of the voltage-controlled oscillator according to the third embodiment. In addition, it is possible to control the capacitance switching voltage by controlling the MOS transistor threshold voltage independently of the second temperature characteristic compensation signal and the second frequency control signal, thereby changing a frequency based on a predetermined control voltage value.

In addition, since it is possible to input the second frequency control signal independently of the second temperature characteristic compensation signal and the second deviation control signal, thereby conveniently designing the second temperature characteristic compensation signal generation circuit 16b or the second frequency control signal generation circuit 15b.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Eighth Embodiment

Figure 11:
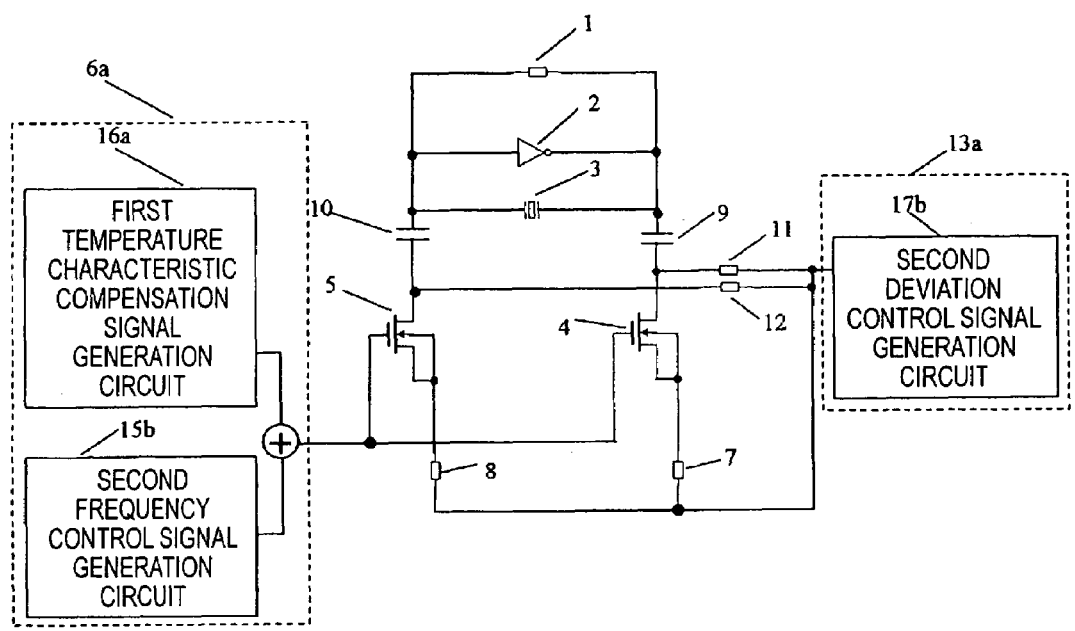
FIG. 11 is a circuit diagram showing a configuration of a voltage-controlled oscillator according to an eighth embodiment of the invention.

FIG. 11 is a circuit diagram showing a configuration of a voltage-controlled oscillator according to an eighth embodiment of the invention.

A voltage-controlled oscillator according to the eighth embodiment is configured such that, in the voltage-controlled oscillator according to the third embodiment, the first control signal generation circuit 6a includes the first temperature characteristic compensation signal generation circuit 16a and the second frequency control signal generation circuit 15b and generates a signal, as the first control signal 6, obtained by overlapping the first temperature characteristic compensation signal and the second frequency control signal, and the second control signal generation circuit 13a includes the second deviation control signal generation circuit 17b and generates the second deviation control signal as the second control signal 13.

According to the above-mentioned configuration, the voltage-controlled oscillator according to the eighth embodiment has the same feature as that of the voltage-controlled oscillator according to the third embodiment. In addition, it is possible to control the capacitance switching voltage by controlling the MOS transistor threshold voltage independently of the first temperature characteristic compensation signal and the second frequency control signal, thereby changing a frequency based on a predetermined control voltage value.

In addition, since it is possible to input the second deviation control signal independently of the first temperature characteristic compensation signal and the second frequency control signal, thereby conveniently designing the first temperature characteristic compensation signal generation circuit 16a or the second frequency control signal generation circuit 15b.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Ninth Embodiment

Figure 12:
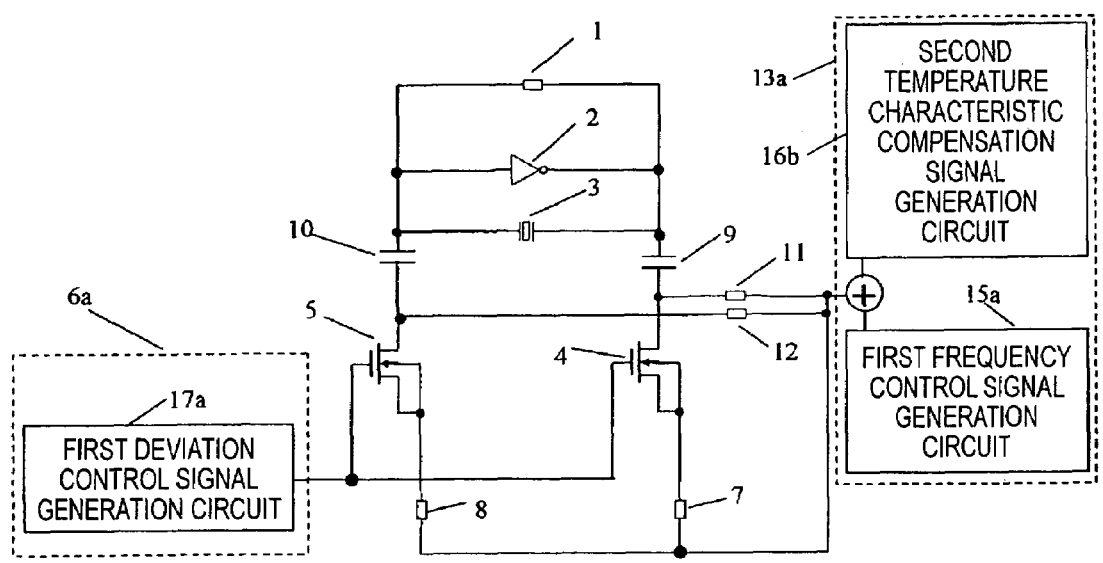
FIG. 12 is a circuit diagram showing a configuration of a voltage-controlled oscillator according to a ninth embodiment of the invention.

FIG. 12 is a circuit diagram showing a configuration of a voltage-controlled oscillator according to a ninth embodiment of the invention.

A voltage-controlled oscillator according to the ninth embodiment is configured such that, in the voltage-controlled oscillator according to the third embodiment, the first control signal generation circuit 6a includes the first deviation control signal generation circuit 17a and generates the first deviation control signal as the first control signal 6, and the second control signal generation circuit 13a includes the second temperature characteristic compensation signal generation circuit 16b and the first frequency control signal generation circuit 15a and generates a signal, as the second control signal 13, obtained by overlapping the second temperature characteristic compensation signal and the first frequency control signal.

According to the above-mentioned configuration, the voltage-controlled oscillator according to the ninth embodiment has the same feature as that of the voltage-controlled oscillator according to the third embodiment. In addition, it is possible to control the capacitance switching voltage by controlling the MOS transistor threshold voltage independently of the second temperature characteristic compensation signal and the first frequency control signal, thereby changing a frequency based on a predetermined control voltage value.

In addition, since it is possible to input the first deviation control signal independently of the second temperature characteristic compensation signal and the first frequency control signal, thereby conveniently designing the second temperature characteristic compensation signal generation circuit 16b or the first frequency control signal generation circuit 15a.

In addition, it is possible to achieve a high yield by compensating for the temperature characteristic of the piezoelectric vibrator by a predetermined control voltage and controlling the frequency by an external voltage, and, at the same time, canceling the MOS transistor threshold voltage deviation and temperature characteristic.

Tenth Embodiment

Figure 13:
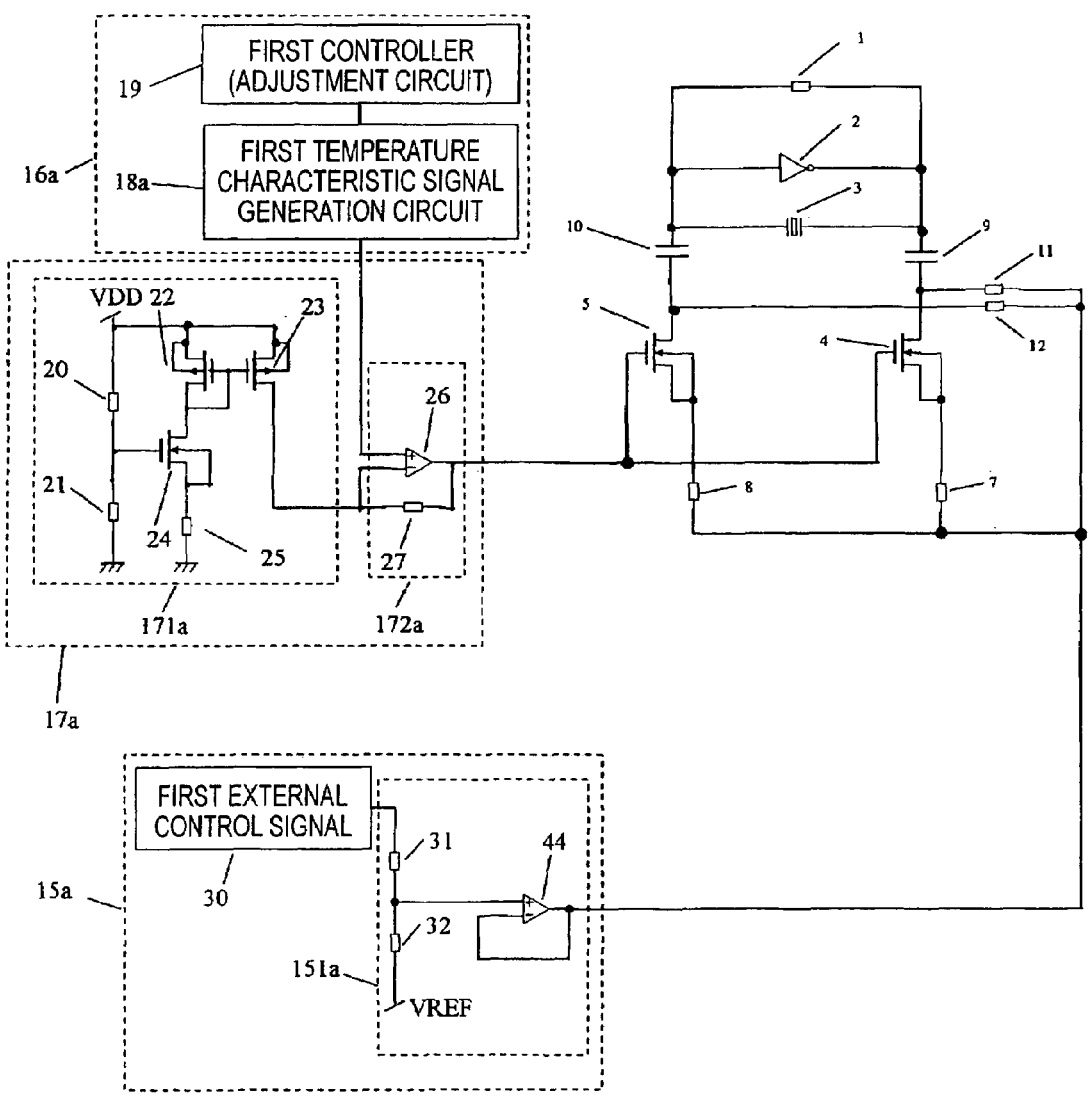
FIG. 13 is a circuit diagram showing a configuration of a voltage-controlled oscillator according to a tenth embodiment of the invention.

FIG. 13 is a circuit diagram showing a configuration of a voltage-controlled oscillator according to a tenth embodiment of the invention.

A voltage-controlled oscillator according to the tenth embodiment is configured such that, in the voltage-controlled oscillator according to the fourth embodiment, the first temperature characteristic compensation signal generation circuit 16a includes a first temperature characteristic signal generation circuit 18a and a first controller 19, and generates a temperature characteristic signal generated from the first temperature characteristic signal generation circuit 18a as the first temperature characteristic compensation signal by an adjustment control signal generated from the first controller 19, the first deviation control signal generation circuit 17a includes a first current generation circuit 171a, which increases/decreases an output current with negative phase according to MOS transistor threshold voltage deviation and, at the same time, increases/decreases an output current with negative phase according to MOS transistor temperature characteristic, and a first current-voltage conversion circuit 171a, which converts the increase/decrease of the output current of the first current generation circuit 171a into an output signal with negative phase, and generates the output signal of the first current-voltage conversion circuit 172a as the first deviation control signal, and the first frequency control signal generation circuit includes a first positive amplification unit 151a, and generates, as the first frequency control signal, a first external control signal 30 applied to the first positive amplification unit 151a with a positive gain added.

The first current generation circuit 171a includes a third MOS transistor 22 and a fourth MOS transistor 23, which constitute a first current mirror, a sixth resistor 20 and a seventh resistor 21, which are connected to source terminals of the two MOS transistors, a fifth MOS transistor 24, which is connected to drain terminals of the MOS transistors, and an eighth resistor 25, which is connected to source and backgate terminals of the fifth MOS transistor 24. The first current-voltage conversion circuit 172a includes a first operational amplifier 26 and a ninth resistor 27. The first positive amplification unit 151a includes a second operational amplifier 44, a tenth resistor 31, and an eleventh resistor 32.

According to the above-mentioned configuration, the voltage-controlled oscillator according to the tenth embodiment has the same feature as that of the voltage-controlled oscillator according to the fourth embodiment. In addition, the capacitance switching voltage of the MOS transistor is changed with the threshold voltage of the MOS transistor. However, a signal having a voltage changed to cancel a change of the capacitance switching voltage is input to the capacitance switching control terminal by the first deviation control signal generation circuit 17a including the first current generation circuit 171a and the first current-voltage conversion circuit 172a. Accordingly, it is possible to cancel the threshold voltage deviation and temperature characteristic of the MOS transistor.

In addition, it is possible to generate the first temperature characteristic compensation signal obtained by adjusting a temperature characteristic signal generated from the first temperature characteristic signal generation circuit 18a with a high accuracy by a control signal of the first controller 19 according to a deviation of temperature characteristic of oscillation frequency of each crystal. In addition, it is possible to compensate for the temperature characteristic of a high-density oscillation frequency.

Further, the third MOS transistor 22 and the fourth MOS transistor 23 included in the first current mirror may be replaced with bipolar transistors.

Eleventh Embodiment

Figure 14:
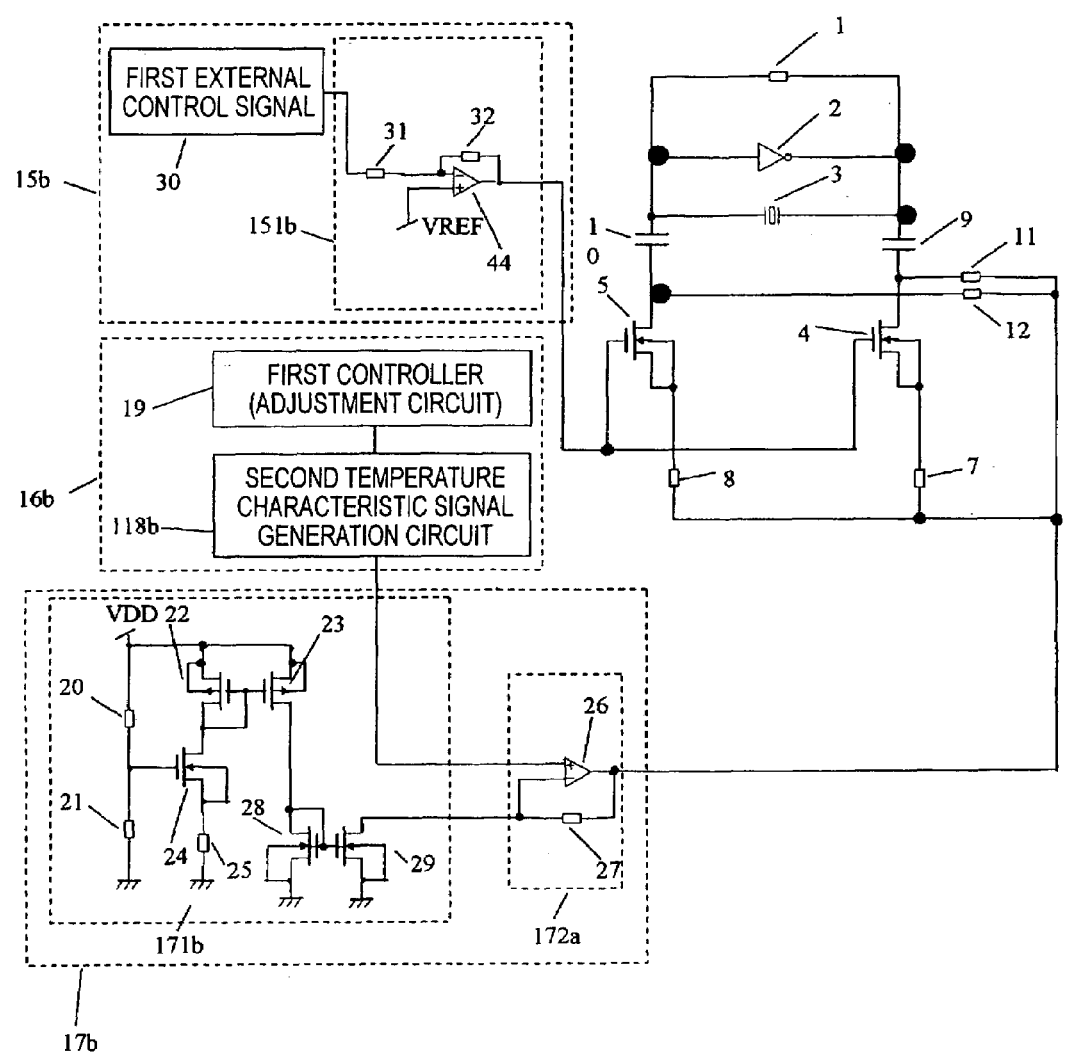
FIG. 14 is a circuit diagram showing a configuration of a voltage-controlled oscillator according to an eleventh embodiment of the invention.

FIG. 14 is a circuit diagram showing a configuration of a voltage-controlled oscillator according to an eleventh embodiment of the invention.

A voltage-controlled oscillator according to the eleventh embodiment is configured such that, in the voltage-controlled oscillator according to the seventh embodiment, the second temperature characteristic compensation signal generation circuit 16b includes a second temperature characteristic signal generation circuit 18b and the first controller 19, and generates a temperature characteristic signal generated from the second temperature characteristic signal generation circuit 18b as the second temperature characteristic compensation signal by an adjustment control signal generated from the first controller 19, the second deviation control signal generation circuit 17b includes a second current generation circuit 171b, which increases/decreases an output current with positive phase according to MOS transistor threshold voltage deviation and, at the same time, increases/ decreases an output current with positive phase according to MOS transistor temperature characteristic, and a first current-voltage conversion circuit 172a, which converts the increase/decrease of the output current of the second current generation circuit 171b into an output signal with negative phase, and generates the output signal of the first current-voltage conversion circuit 172a as the second deviation control signal, and the second frequency control signal generation circuit 15b includes a first reverse amplification unit 151b, and generates, as the second frequency control signal, a first external control signal 30 applied to the first reverse amplification unit 151b with a negative gain added.

The second current generation circuit 171b includes a sixth MOS transistor 28 and a seventh MOS transistor 29, which constitute a second current mirror, in addition to the first current generation circuit 171a. The first reverse amplification unit 151b includes a second operational amplifier 44, a tenth resistor 31, and an eleventh resistor 32.

According to the above-mentioned configuration, the voltage-controlled oscillator according to the eleventh embodiment has the same feature as that of the voltage-controlled oscillator according to the seventh embodiment. In addition, the capacitance switching voltage of the MOS transistor is changed with the threshold voltage of the MOS transistor. However, a signal having a voltage changed to cancel a change of the capacitance switching voltage is input to the capacitance switching control terminal by the second deviation control signal generation circuit 17b including the second current generation circuit 171b and the first current-voltage conversion circuit 172a. Accordingly, it is possible to cancel the threshold voltage deviation and temperature characteristic of the MOS transistor.

In addition, it is possible to generate the second temperature characteristic compensation signal obtained by adjusting a temperature characteristic signal generated from the second temperature characteristic signal generation circuit 18b with a high accuracy by a control signal of the first controller 19 according to a deviation of temperature characteristic of oscillation frequency of each crystal. In addition, it is possible to compensate for the temperature characteristic of a high-density oscillation frequency.

Further, the third MOS transistor 22 and the fourth MOS transistor 23, which constitute the first current mirror, and the sixth MOS transistor 28 and the seventh MOS transistor 29, which constitute the second current mirror, may be replaced with bipolar transistors.

In addition, when the first temperature characteristic compensation signal generation circuit 16a, the second temperature characteristic compensation signal generation circuit 16b, the first frequency control signal generation circuit 17a, the second frequency control signal generation circuit 17b, the first deviation control signal generation circuit 15a, and the second deviation control signal generation circuit 15b, which are used in the tenth and eleventh embodiments, are used in the fifth, sixth, eighth, and ninth embodiments, the same characteristics as those of the tenth and eleventh embodiments can be acquired.

Twelfth Embodiment

Figure 15:
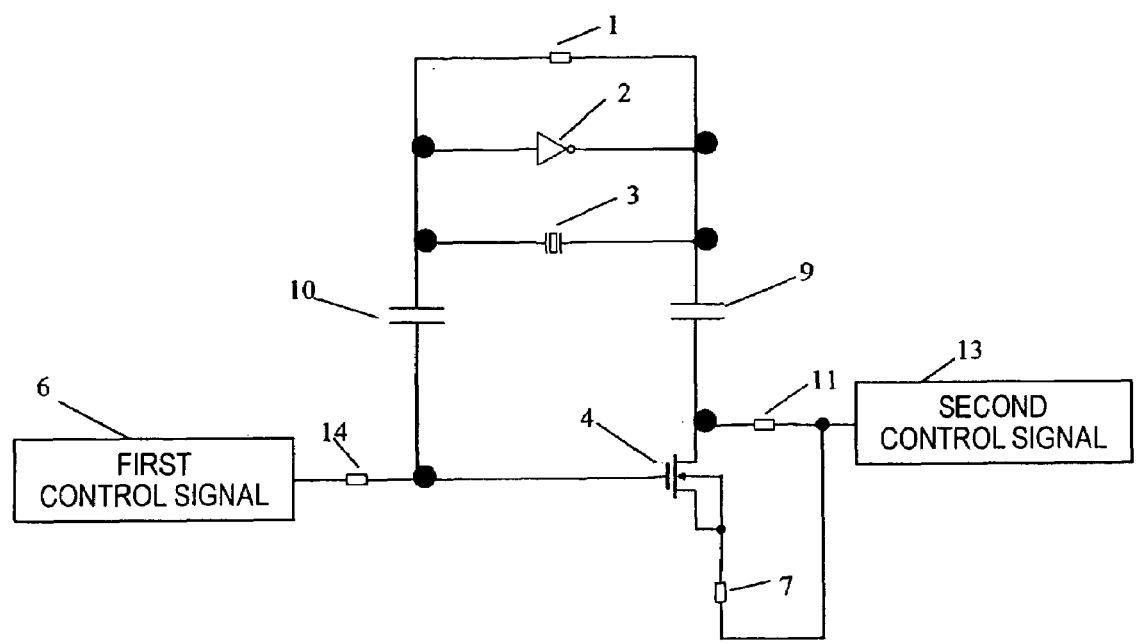
FIG. 15 is a circuit diagram showing a configuration of a voltage-controlled oscillator according to a twelfth embodiment of the invention.

FIG. 15 is a circuit diagram showing a configuration of a voltage-controlled oscillator according to a twelfth embodiment of the invention.

A voltage-controlled oscillator according to the twelfth embodiment is configured such that, in the voltage-controlled oscillator according to the respective embodiments, the gate terminal of the first MOS transistor 4 is connected to each of a terminal of the second DC cut capacitor 10, which is not connected to the input terminal of the inverter 2, and a terminal of a fifth frequency elimination resistor 14, instead of the second MOS transistor 5, second high-frequency elimination resistor 8, and fourth high-frequency elimination resistor 12, and the first control signal 6 is input to the gate terminal of the first MOS transistor 4 through the other end of the fifth high-frequency elimination resistor 14.

According to the above-mentioned configuration, the voltage-controlled oscillator according to the twelfth embodiment has the same feature as that of the voltage-controlled oscillator according to the respective embodiments. In addition, since the gate and drain terminals of the first MOS transistor 4 are 180° different in phase from each other, the MOS variable capacitor is doubled due to a mirror effect. Accordingly, it is possible to increase a ratio of change in frequency to change in control voltage of MOS variable capacitor, i.e., frequency variable sensitivity.

In addition, since a dynamic range of the control voltage increase, it is possible to increase a width of change in frequency. Accordingly, it is possible to reduce the size of the first MOS transistor 4, thus miniaturizing the chip size.

While the NMOS transistor is employed in the above-mentioned embodiments, a PMOS transistor may be used.

The voltage-controlled oscillator according to the invention can be used as a voltage-controlled temperature-compensated crystal oscillator since it can control an oscillation frequency using a static capacitance generated between a source-drain terminal and a gate terminal of a MOS transistor as a variable capacitor.

What is claimed is:
1. A voltage-controlled oscillator comprising:
    an amplifier, which includes an inverter and a feedback resistor;
    a piezoelectric, vibrator which is connected to input and output terminals of the amplifier;
    a variable capacitive element, which includes a variable capacitor and first and second DC cut capacitors of which one end is respectively connected to both terminals of the piezoelectric vibrator and which serve as load capacitors between the terminals of the piezoelectric vibrator,
    wherein the variable capacitor includes:
    first and second MOS transistors, in which a drain terminal is connected to the other end of the first and second DC cut capacitors, source and backgate terminals are shorted to each other, and a gate terminal is shorted;
    first and second high-frequency elimination resistors in which one end thereof is connected to each of a source-backgate terminal of the first and second MOS transistors; and
    third and fourth high-frequency elimination resistors in which one end thereof is respectively connected to each of the drain terminals of the first and second MOS transistors and the other end is connected to each other, and
    an oscillation frequency is controlled by a first control signal which is formed by a static capacitance generated between the drain and gate terminals of the first MOS transistor and a static capacitance generated between the drain and gate terminals of the second MOS transistor and is input to the gate terminals connected to the first and second MOS transistors when an oscillation voltage is applied to the drain terminals of the first and second MOS transistors, and
    a second control signal which is input to each drain terminals of the first and second MOS transistors through the third and fourth high-frequency elimination resistors, respectively, and is input to the source-back-gate terminals of the first and second MOS transistors through the first and second high-frequency elimination resistors, respectively.

2. The voltage-controlled oscillator according to claim 1, wherein the variable capacitive element is obtained by connecting the first and second DC cut capacitors between both terminals of the inverter and both terminals of the piezoelectric vibrator.

3. The voltage-controlled oscillator according to claim 1, wherein a first control signal generation circuit for generating the first control signal is connected to the commonly connected gate terminals of the first and second MOS transistor, and a second control signal generation circuit for generating the second control signal is connected to the drain terminals of the first and second MOS transistors through the third and fourth high-frequency elimination-resistors, respectively, and is connected to the source-back-gate terminals of the first and second MOS transistors through the first and second high-frequency elimination resistors, respectively.

4. The voltage-controlled oscillator according to claim 3, wherein the first control signal generation circuit includes a first temperature characteristic compensation signal generation circuit and a first deviation control signal generation circuit, and generates, as the first control signal, a signal obtained by overlapping a first temperature characteristic compensation signal, which compensates for crystal oscillation frequency temperature characteristic generated from the first temperature characteristic compensation signal generation circuit, and a first deviation control signal, which cancels MOS transistor threshold voltage deviation and temperature characteristic generated from the first deviation control signal generation circuit, and the second control signal generation circuit includes a first frequency control signal generation circuit, and generates, as the second control signal, a first frequency control signal which controls crystal oscillation frequency generated from the first frequency control signal generation circuit.

5. The voltage-controlled oscillator according to claim 3, wherein the first control signal generation circuit includes a second frequency control signal generation circuit and the first deviation control signal generation circuit, and generates, as the first control signal, a signal obtained by overlapping a second frequency control signal, which controls crystal oscillation frequency generated from the second frequency control signal generation circuit and is negative phase which is different from the first frequency control signal, and the first deviation control signal, and the second control signal generation circuit includes a second temperature characteristic compensation signal generation circuit, and generates, as the second control signal, a second temperature characteristic compensation signal which compensates for crystal oscillation frequency temperature characteristic generated from the second temperature characteristic compensation signal generation circuit and is negative phase which is different from the first temperature characteristic compensation signal.

6. The voltage-controlled oscillator according to claim 3, wherein the first control signal generation circuit includes the first temperature characteristic compensation signal generation circuit, and generates the first temperature characteristic compensation signal as the first control signal, and the second control signal generation circuit includes the first frequency control signal generation circuit and the second deviation control signal generation circuit, and generates, as the second control signal, a signal obtained by overlapping the first frequency control signal and a second deviation control signal, which cancels MOS transistor threshold voltage deviation and temperature characteristic generated from the second deviation control signal generation circuit and is negative phase which is different from the first deviation control signal.

7. The voltage-controlled oscillator according to claim 3, wherein the first control signal generation circuit includes the second frequency control signal generation circuit, and generates the second frequency control signal as the first control signal, and the second control signal generation circuit includes the second temperature characteristic compensation signal generation circuit and the second deviation control signal generation circuit, and generates, as the second control signal, a signal obtained by overlapping the second temperature characteristic compensation signal and the second deviation control signal.

8. The voltage-controlled oscillator according to claim 3, wherein the first control signal generation circuit includes the first temperature characteristic compensation signal generation circuit and the second frequency control signal generation circuit, and generates, as the first control signal, a signal obtained by overlapping the first temperature characteristic compensation signal and the second frequency control signal, and the second control signal generation circuit includes the second deviation control signal generation circuit, and generates the second deviation control signal as the second control signal.

9. The voltage-controlled oscillator according to claim 3, wherein the first control signal generation circuit includes the first deviation control signal generation circuit, and generates the first deviation control signal as the first control signal, and the second control signal generation circuit includes the second temperature characteristic compensation signal generation circuit and the first frequency control signal generation circuit, and generates, as the second control signal, a signal obtained by overlapping the second temperature characteristic compensation signal and the first frequency control signal.

10. The voltage-controlled oscillator according to claim 4, wherein the first temperature characteristic compensation signal generation circuit includes a first temperature characteristic signal generation circuit and a first controller, and generates a temperature characteristic signal generated from the first temperature characteristic signal generation circuit as the first temperature characteristic compensation signal by an adjustment control signal generated from the first controller, the second temperature characteristic compensation signal generation circuit includes a second temperature characteristic signal generation circuit and the first controller, and generates a temperature characteristic signal generated from the second temperature characteristic signal generation circuit as the second temperature characteristic compensation signal by an adjustment control signal generated from the first controller, the first deviation control signal generation circuit includes a first current generation circuit which increases/decreases an output current with negative phase according to MOS transistor threshold voltage deviation and, at the same time, increases/decreases an output current with negative phase according to MOS transistor temperature characteristic, and a first current-voltage conversion circuit which converts the increase/decrease of the output current of the first current generation circuit into an output signal with negative phase, and generates the output signal of the first current-voltage conversion circuit as the first deviation control signal, the second deviation control signal generation circuit includes a second current generation circuit which increases/decreases an output current with positive phase according to MOS transistor threshold voltage deviation and, at the same time, increases/decreases an output current with positive phase according to MOS transistor temperature characteristic, and a first current-voltage conversion circuit which converts the increase/decrease off the output current of the second current generation circuit into an output signal with negative phase, and generates the output signal of the first current-voltage conversion circuit as the second deviation control signal, the first frequency control signal generation circuit includes a first positive amplification unit, and generates, as the first frequency control signal, a first external control signal applied to the first positive amplification unit with a positive gain added, and the second frequency control signal generation circuit includes a first reverse amplification unit, and generates, as the second frequency control signal, a first external control signal applied to the first reverse amplification unit with a negative gain added.

11. The voltage-controlled oscillator according to claim 1, wherein the gate terminal of the first MOS transistor is connected to each of a terminal of the second DC cut capacitor, which is not connected to the input terminal of the inverter, and one end of a terminal of a fifth frequency elimination resistor, instead of the second MOS transistor, the second high-frequency elimination resistor, and the fourth high-frequency elimination resistor, and the first control signal is input to the gate terminal of the first MOS transistor through the other end of the fifth high-frequency elimination resistor.

* * * * *